US011903093B2

(12) United States Patent
Davydov et al.

(10) Patent No.: US 11,903,093 B2
(45) Date of Patent: Feb. 13, 2024

(54) PHYSICAL DOWNLINK SHARED CHANNEL TRANSMISSION FOR MULTI-POINT

(71) Applicant: Apple Inc., Cupertino, CA (US)

(72) Inventors: Alexei Davydov, Nizhny Novogorod (RU); Gregory V. Morozov, Nizhny Novgorod (RU); Victor Sergeev, Nizhny Novgorod (RU); Ajit Nimbalker, Fremont, CA (US); Grigory Ermolaev, Nizhny Novgorod (RU); Dmitry Dikarev, Nizhny Novgorod (RU)

(73) Assignee: Apple Inc., Cupertino, CA (US)

(*) Notice: Subject to any disclaimer, the term of this patent is extended or adjusted under 35 U.S.C. 154(b) by 0 days.

(21) Appl. No.: 17/949,957

(22) Filed: Sep. 21, 2022

(65) Prior Publication Data

US 2023/0015776 A1    Jan. 19, 2023

Related U.S. Application Data

(62) Division of application No. 16/638,090, filed as application No. PCT/US2018/046376 on Aug. 10, 2018, now Pat. No. 11,647,563.

(Continued)

(51) Int. Cl.
*H04W 4/00* (2018.01)
*H04W 88/06* (2009.01)
(Continued)

(52) U.S. Cl.
CPC .......... *H04W 88/06* (2013.01); *H03M 13/13* (2013.01); *H04B 7/0413* (2013.01);
(Continued)

(58) Field of Classification Search
CPC ... H04W 88/06; H04W 4/06; H04W 72/1273; H03M 13/13; H04B 7/0413;
(Continued)

(56) References Cited

U.S. PATENT DOCUMENTS 8,937,897 B2    1/2015 Hoshino et al.
9,692,573 B2 *  6/2017 Hwang ................ H04L 5/0057
(Continued)

FOREIGN PATENT DOCUMENTS

EP    2 919 538 A1    9/2015

OTHER PUBLICATIONS

ZTE: "Downlink control signaling for CoMP", 3GPP Draft; R1-124626, 3rd Generation Partnership Project (3GPP), Mobile Competence Centre ; 650, Route Des Lucioles ; F-06921 Sophia-Antipolis Cedex ; France, vol. RAN WG1, No. San Diego, USA; Oct. 8, 2012-Oct. 12, 2012 Oct. 12, 2012 (Oct. 12, 2012), XP050662487, Retrieved from the Internet: URL:http://www.3gpp.org/ftp/tsg -ran/ WG1 -RL 1/TSGR1 _70b/Docs/ [retrieved on Oct. 12, 2012 ].

(Continued)

*Primary Examiner* — Helene E Tayong
(74) *Attorney, Agent, or Firm* — Sterne, Kessler, Goldstein & Fox P.L.L.C.

(57) ABSTRACT

Described is an apparatus of a User Equipment (UE) operable to communicate with a fifth generation Evolved Node-B (gNB) on a wireless network. The apparatus includes a first circuitry and a second circuitry. The first circuitry may be operable to determine a first parameter set and a second parameter set for establishing Physical Downlink Shared Channel (PDSCH) resources. The second circuitry may be operable to process a first part of a PDSCH transmission from a first set of Multiple Input Multiple Output (MIMO) layers corresponding with a first Multimedia Broadcast Single Frequency Network (MBSFN) con- (Continued)

figuration based on the first parameter set. The second circuitry may also be operable to process a second part of the PDSCH transmission from a second set of MIMO layers corresponding with a second MBSFN configuration based on the second parameter set.

20 Claims, 9 Drawing Sheets

Related U.S. Application Data

(60) Provisional application No. 62/544,629, filed on Aug. 11, 2017, provisional application No. 62/544,657, filed on Aug. 11, 2017.

(51) Int. Cl.
| | | |
|---|---|---|
| *H03M 13/13* | (2006.01) | |
| *H04B 7/0413* | (2017.01) | |
| *H04B 7/06* | (2006.01) | |
| *H04L 5/00* | (2006.01) | |
| *H04W 4/06* | (2009.01) | |
| *H04W 72/1273* | (2023.01) | |

(52) U.S. Cl.
CPC ......... *H04B 7/0626* (2013.01); *H04B 7/0632* (2013.01); *H04B 7/0639* (2013.01); *H04L 5/0035* (2013.01); *H04L 5/0044* (2013.01); *H04W 4/06* (2013.01); *H04W 72/1273* (2013.01)

(58) Field of Classification Search
CPC .. H04B 7/0626; H04B 7/0632; H04B 7/0639; H04B 7/024; H04L 5/0035; H04L 5/0044; H04L 1/0008; H04L 1/0026; H04L 5/0007; H04L 5/0057
USPC .......................................................... 370/329
See application file for complete search history.

(56) References Cited

U.S. PATENT DOCUMENTS

| | | | |
|---|---|---|---|
| 10,334,560 B2 | 6/2019 | Kim et al. | |
| 11,121,744 B2 | 9/2021 | Park et al. | |
| 2010/0272019 A1* | 10/2010 | Papasakellariou | .... H04L 1/1664 |
| | | | 370/328 |
| 2011/0249643 A1* | 10/2011 | Barbieri | ................ H04L 1/0026 |
| | | | 370/328 |
| 2011/0269490 A1* | 11/2011 | Earnshaw | ............. H04L 5/0053 |
| | | | 455/509 |
| 2012/0076023 A1* | 3/2012 | Ko | .......................... H04L 5/006 |
| | | | 370/252 |
| 2014/0119266 A1 | 5/2014 | Ng et al. | |
| 2014/0169492 A1* | 6/2014 | Mahdavifar | .......... H03M 13/13 |
| | | | 375/267 |
| 2015/0189622 A1 | 7/2015 | Jang et al. | |
| 2015/0296513 A1 | 10/2015 | Nogami et al. | |
| 2016/0029383 A1 | 1/2016 | Jang et al. | |
| 2016/0248561 A1 | 8/2016 | Davydov et al. | |
| 2016/0285605 A1 | 9/2016 | Andersson et al. | |
| 2016/0344575 A1 | 11/2016 | Gong et al. | |
| 2020/0178351 A1 | 6/2020 | Davydov et al. | |
| 2021/0143843 A1* | 5/2021 | Nimbalker | ............ H04L 1/0008 |

OTHER PUBLICATIONS

Intel Corporation: "Support of NC-JT in TM9", 3GPP Draft; R1-1708289 Support of NC-JT in TM9, 3rd Generation Partnership Project (3GPP), Mobile Competence Centre ; 650, Route Des Lucioles ; F-06921 Sophia-Antipolis Cedex ; FRANCE, vol. RAn WG1, No. Hangzhou; May 15, 2017-May 19, 2017, May 14, 2017 (May 14, 2017), XP051273482, Retrieved from the Internet: URL:http://www.3gpp.org/ftp/Meetings -3GPP - SYNC/RAN1/Docs/ [retrieved on May 14, 2017].

Huawei Hisilicon Intel Ericsson ZTE: "WF on QCL for FeCoMP", 3GPP Draft; R1-1709390, 3rd Generation Partnership Project (3GPP), Mobile Competence Centre ; 650, Route Des Lucioles ; F- 06921 Sophia-Antipolis Cedex ; France, vol. RAN WG1, No. Hangzhou; May 15, 2017-May 19, 2017, May 17, 2017 (May 17, 2017), XP051285049, Retrieved from the Internet: URL:http://www.3gpp.org/ftp/tsg -ran/WG1 -RL 1/TSGR1 89/Docs/ [retrieved on May 17, 2017].

International Search Report and Written Opinion directed to related PCT Patent Application No. PCT/US2018/046376, dated Dec. 20, 2018; 16 pages.

* cited by examiner

PHYSICAL DOWNLINK SHARED CHANNEL TRANSMISSION FOR MULTI-POINT

CLAIM OF PRIORITY

The present application is a divisional of U.S. non-provisional patent application Ser. No. 16/638,090 filed on Feb. 10, 2020, which is a U.S. National Stage entry of PCT/US2018/046376, filed on Aug. 10, 2018, which claims priority under 35 U.S.C. § 119 to U.S. Provisional Patent Application Ser. No. 62/544,657 filed Aug. 11, 2017 and entitled "METHOD, APPARATUS, AND SYSTEM OF PHYSICAL DOWNLINK SHARED CHANNEL TRANSMISSION FOR MULTI-POINT," and to U.S. Provisional Patent Application Ser. No. 62/544,629 filed Aug. 11, 2017 and entitled "CHANNEL STATE INFORMATION CODING USING POLAR CODES," the entire disclosures of all of which are herein incorporated by reference in their entireties.

BACKGROUND

A variety of wireless cellular communication systems have been implemented, including a 3rd Generation Partnership Project (3GPP) Universal Mobile Telecommunications Systems (UMTS) system, a 3GPP Long-Term Evolution (LTE) system, and a 3GPP LTE-Advanced (LTE-A) system. Next-generation wireless cellular communication systems based upon LTE and LTE-A systems are being developed, such as a Fifth Generation (5G) wireless system/ 5G mobile networks system.

Next-generation wireless cellular communication systems may provide support for higher bandwidths in pan by supporting Non-Coherent Joint Transmission (NC-JT).

BRIEF DESCRIPTION OF DRAWINGS

The embodiments of the disclosure will be understood more fully from the detailed description given below and from the accompanying drawings of various embodiments of the disclosure. However, while the drawings are to and in explanation and understanding, they are only an and, and should not be taken to limit the disclosure to the specific embodiments depicted therein.

DETAILED DESCRIPTION

Various wireless cellular communication systems have been implemented or are being proposed, including 3rd Generation Partnership Project (3GPP) Universal Mobile Telecommunications Systems (UMTS), 3GPP Long-Term Evolution (LTE) systems, 3GPP LTE-Advanced (LTE-A) systems, and 5th Generation (5G) wireless systems/5G mobile networks systems/5G New Radio (NR) systems. With respect to various embodiments, a 5G system and/or an NR system may support. Further Enhanced Coordinated Multi-Point (FeCoMP) functionality.

Figure 1:
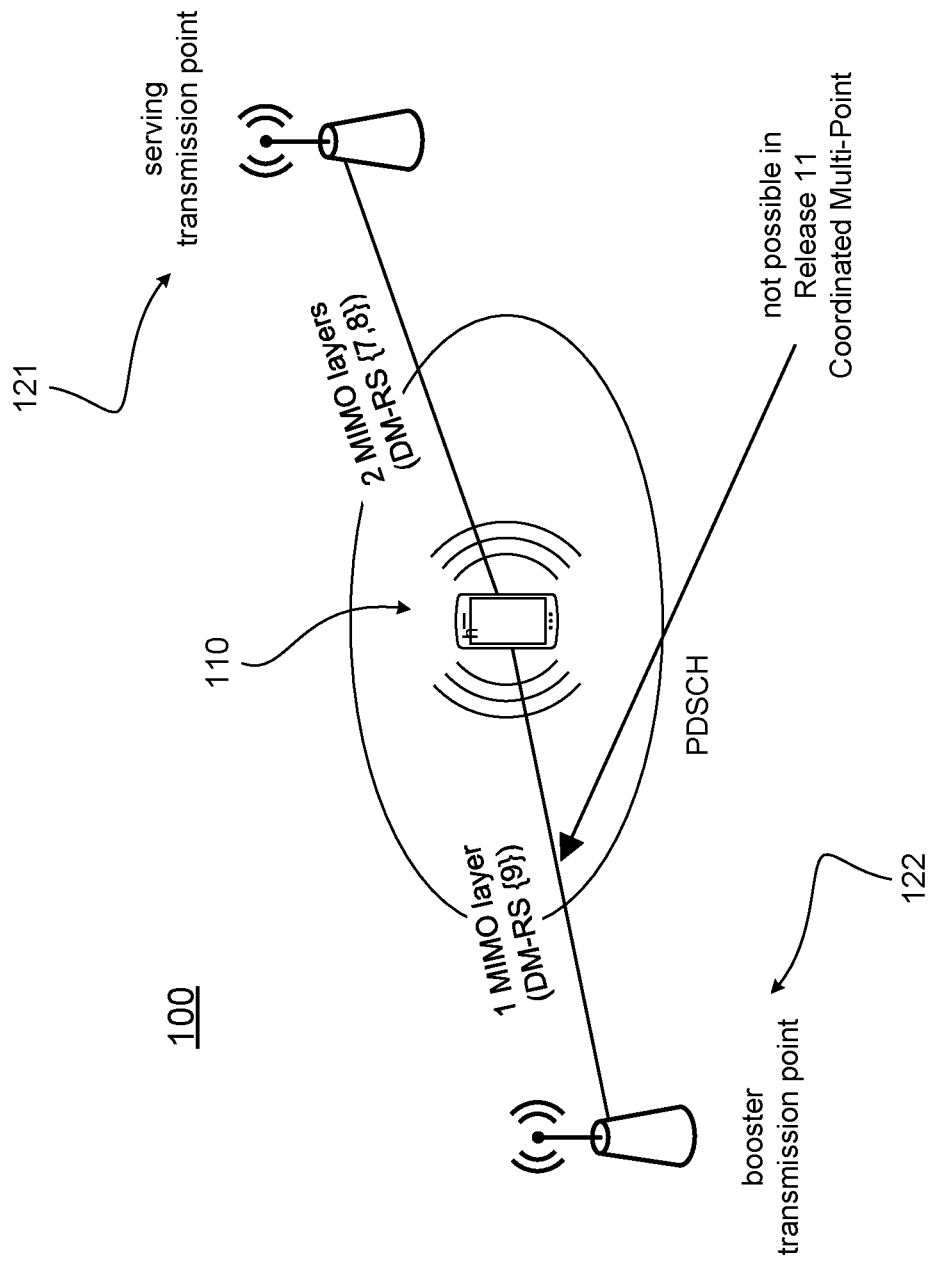
FIG. 1 illustrates a scenario of Non-Coherent Joint Transmission (NC-JT) from a plurality of Transmission Points (TPs) to a User Equipment (UE), in accordance with some embodiments of the disclosure.

With respect to a variety of embodiments, FIG. 1 illustrates a scenario of Non-Coherent Joint Transmission (NC-JT) from a plurality of Transmission Points (TPs) to a User Equipment (UE), in accordance with some embodiments of the disclosure. A UE 110 may be in wireless communication both with a first TP 121 and a second TP 122. First TP 121 may be a serving TP, and second TP 122 may be a booster TP.

In NC-JT, different Multiple Input Multiple Output (MIMO) layers and corresponding Demodulation Reference Signal (DM-KS) Antenna Ports (APs) may be transmitted from different TPs. For example, a transmission from first TP 121 may correspond with two MIMO layers and DM-RS APs 7 and 8, while a transmission from second TP 122 may correspond with one MIMO layer and DM-RS AP 9.

Various parameters corresponding to Physical Downlink Shared Channel (PDSCH) transmission from each TP may be configured in parameter sets (e.g., PDSCH-RE-MappingQCL sets). For actual PDSCH transmission, a UE may be provided with two or more actual parameter sets relevant to a scheduled PDSCH. Due to transmission from different TPs, some transmission parameters (such as a PDSCH starting position) may not be aligned. Accordingly, various embodiments may pertain to rules to resolve possible ambiguities in parameter settings.

In addition to support frequency selective Dynamic Point Selection (DPS) using an NC-JT framework, a Resource Allocation (RA) for one set of MIMO layers corresponding with a first TP and an RA for another set of MIMO layers corresponding to a second TP may be different. Accordingly, in various embodiments, to support such transmission schemes, RA information may also be provided per MIMO layer set or per DM-RS AP group (or both). There may therefore be additional overhead in a Downlink Control information (DCI) indication.

Disclosed herein are mechanisms and methods for PDSCH starting symbol determination. In some embodiments, for a given subframe that is a Multimedia Broadcast Single Frequency Network (MBSFN) subframe (for at least one of the TPs), a PDSCH starting symbol may be determined according to an MBSFN subframe rule, otherwise, the PDSCH starting symbol may be determined according to a non-MBSFN subframe rule. For some embodiments, MBSFN subframe configurations may be disposed to being the same across TPs.

Also disclosed herein are mechanisms and methods for RA indication. Some embodiments may pertain to an indication of two or more RAs with Resource Block Group (RBG) size scaled in such way as to fit a pay load size of a DCI (e.g., with a conventional DCI Format) within a single RA field.

With respect to a variety of embodiments, due to dependencies between Channel State Information (CSI) components in legacy LTE systems, coding of CSI Reference Signal Resource Index (CRI)/Rank Indication (RI) and Precoding Matrix Indication (PMI)/Channel Quality indicator (CQI) may be carried out independently from each other. The bandwidth of CRI/RI may be typically known by a base station based on a higher layer configuration, or may be derived from a CSI Reference Signal (CSI-RS) AP configuration and/or a reported UE capability. Based on a decoded CRI/RI, a UE may determine a payload size of a PMI/CQI report. For example, for LTE, if a reported RI is "1" Uplink Control information (UCI) may be disposed to carrying a single CQI report, otherwise, UCI may be disposed to carrying two CQI reports. In addition, a bit width of a PMI report may also depend on a reported RI.

From a coding perspective, it may be desirable to use a common coding for all CSI components. However, due to variable sizes of UCI, the conventional approach may assume a maximum possible payload size for UCI reporting.

Disclosed herein are mechanisms and methods for a common coding for CSI. In some embodiments, a minimum portion of PMI, a minimum portion of CQI, an RI, and a CRI may be placed on a first group of bit indices in a polar code, and a remaining portion of PMI and a remaining portion of CQI may be placed on a second group of bit indices in the polar code. A common coding for all CSI components may advantageously have better coding efficiency.

In the following description, numerous details are discussed to provide a more thorough explanation of embodiments of the present disclosure. It will be apparent to one skilled in the art, however, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate a greater number of constituent signal paths, and/or have arrows at one or more ends, to indicate a direction of information flow. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical, mechanical, or magnetic connection between the things that are connected, without any intermediary devices. The term "coupled" means either a direct electrical mechanical, or magnetic connection between the things that are connected or an indirect connection through one or more passive or active intermediary devices. The term "circuit" or "module" may refer to one or more passive and/or active components dial are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The terms "substantially," "close," "approximately," "near," and "about" generally refer to being within +/−10% of a target value. Unless otherwise specified the use of the ordinal adjectives "first" "second," and "third," etc., to describe a common object, merely indicate that different instances of like objects are being referred to, and are not intended to imply that the objects so described must be in a given sequence, either temporally, spatially, in ranking, or in any other manner.

It is to be understood that the terms so used are interchangeable under appropriate circumstances such that the embodiments of the invention described herein are, for example, capable of operation in other orientations than those illustrated or otherwise described herein.

The terms "left," "right." "front," "back," "top," "bottom," "over," "under," and the like in the description and in the claims, if any, are used for descriptive purposes and not necessarily for describing permanent relative positions.

For purposes of the embodiments, the transistors in various circuits, modules, and logic blocks are Tunneling FETs (TFETs). Some transistors of various embodiments may comprise metal oxide semiconductor (MOS) transistors, which include drain, source, gate, and bulk terminals. The transistors may also include Tri-Gate and FinFET transistors Gate All Around Cylindrical Transistors, Square Wire, or Rectangular Ribbon Transistors or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors—BJT PNP/NPN, BiCMOS, CMOS, etc., may be used for some transistors without departing from the scope of the disclosure.

For the purposes of the present disclosure, the phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

In addition, the various elements of combinatorial logic and sequential logic discussed in the present disclosure may pertain both to physical structures (such as AND gates, OR gates, or XOR gates), or to synthesized or otherwise optimized collections of devices implementing the logical structures that are Boolean equivalents of the logic under discussion.

In addition, for purposes of the present disclosure, the term "eNB" may refer to a legacy LTE capable Evolved Node-B (eNB), a next-generation or 5G capable eNB, an Access Point (AP), a Transmission Point (TP), and/or another base station for a wireless communication system. The term "gNB" may refer to a 5G-capable or NR-capable eNB. For purposes of the present disclosure, the term "UE" may refer to a legacy LTE capable User Equipment (UE), a Station (STA), and/or another mobile equipment for a wireless communication system. The term "UE" may also refer to a next-generation or 5G capable UE.

Various embodiments of eNBs and/or UEs discussed below may process one or more transmissions of various types. Some processing of a transmission may comprise demodulating, decoding, detecting, parsing, and/or otherwise handling a transmission that has been received. In some embodiments, an eNB or UE processing a transmission may determine or recognize the transmission's type and/or a condition associated with the transmission. For some embodiments, an eNB or UE processing a transmission may act in accordance with the transmission's type, and/or may act conditionally based upon the transmission's type. An eNB or UE processing a transmission may also recognize one or more values or fields of data carried by the transmission. Processing a transmission may comprise moving the transmission through one or more layers of a protocol stack (which may be implemented in, e.g., hardware and/or software-configured elements), such as by moving a transmission that has been received by an eNB or a UE through one or more layers of a protocol stack.

Various embodiments of eNBs and/or UEs discussed below may also generate one or more transmissions of various types. Some generating of a transmission may comprise modulating, encoding, formatting, assembling, and/or otherwise handling a transmission that is to be transmitted. In some embodiments, an eNB or UE generating a transmission may establish the transmission's type and/or a condition associated with the transmission. For some embodiments, an eNB or UE generating a transmission may act in accordance with the transmission's type, and/or may act conditionally based upon the transmission's type. An eNB or UE generating a transmission may also determine one or more values or fields of data carried by the transmission. Generating a transmission may comprise moving the transmission through one or more layers of a protocol stack (which may be implemented in, e.g., hardware and/or software-configured elements), such as by moving a transmission to be sent by an eNB or a UE through one or more layers of a protocol stack.

In various embodiments, resources may span various Resource Blocks (RBs), Physical Resource Blocks (PRBs), and/or time periods (e.g., frames, subframes, and/or slots) of a wireless communication system. In some contexts, allocated resources (e.g., channels, Orthogonal Frequency-Division Multiplexing (OFDM) symbols, subcarrier frequencies, resource elements (REs), and/or portions thereof) may be formatted for (and prior to) transmission over a wireless communication link. In other contexts, allocated resources (e.g., channels, OFDM symbols, subcarrier frequencies, REs, and/or portions thereof) may be detected from (and subsequent to) reception over a wireless communication link.

With respect to a variety of embodiments, in legacy LTE, a PDSCH starting position may depend upon whether a current subframe is an MBSFN subframe or a non-MBSFN subframe. If the PDSCH is assigned by, or is semi-persistently scheduled by a Physical Downlink Control Channel (PDCCH) and/or enhanced PDCCH (EPDCCH) with DCI format 2D, then a starting data symbol parameter (e g, $L_{DATASTART}$) may be established.

In establishing $L_{DATSTART}$, if the subframe on which the PDSCH is received is indicated by a higher-layer parameter determined from DCI for the serving cell on which PDSCH is received (e.g., mbsfn-SubframeConfigList-r11), or if the PDSCH is received on subframe 1 or 6 for frame structure type 2, then $L_{DATASTART}$ may be set to the minimum of either two or the value of $L_{DATASTART}$ provided by DCI (e.g., a DCI Format 2D). Otherwise, $L_{DATASTART}$ may be set to the value of $L_{DATASTART}$ provided by DCI (e.g., a DCI Format 2D).

In some embodiments, in cases m which the current Subframe is a non-MBSFN subframe, the PDSCH starting symbol may be directly obtained front the value $L_{DATASTART}$ provided by DCI Format 2D. For an MBSFN subframe, the $L_{DATASTART}$ indicated by DCI Format 2D may be converted to the actual PDSCH starting symbol by evaluating which is the minimum: two, or the provided $L_{DATASTART}$.

For some embodiments, for NC-JT operation, different TPs may have different MBSFN configurations (with each TP being associated with one parameter set), so a given DL subframe could be an MBSFN subframe and a non MBSFN subframe for two parameter sets. To achieve the same PDSCH starting symbol for both parameter sets, a special rule for PDSCH starting symbol determination may be defined. If a current subframe corresponds so an MBSFN subframe in at least one of parameter sets (e.g., at one TP), a PDSCH starting symbol determination may be disposed to following an MBSFN subframe rule; otherwise, the PDSCH starting symbol may be determined according to non-MBSFN subframe rule.

In some embodiments, MBSFN subframe configurations may be disposed to being the same for both TPs (e.g., the same for both parameter sets).

For some embodiments, to support frequency selective DPS using art NC-JT framework, an RA for one set of MIMO layers corresponding to a first TP and an RA for another set of MIMO layers corresponding to a second TP may be different. To support such transmission schemes, the RA information may be disposed to being provided per MIMO layer set.

Since an RA indication may consume a large amount of DCI bits, an RBG size may be reduced to advantageously reduce the amount of bits required to indicate an RA. The RBG size may be disposed to being selected in such a way that a total overhead from two RAs may correspond to a maximum number of bits below a number of bits supported by an RA indication in an existing DCI Format.

Figure 2:
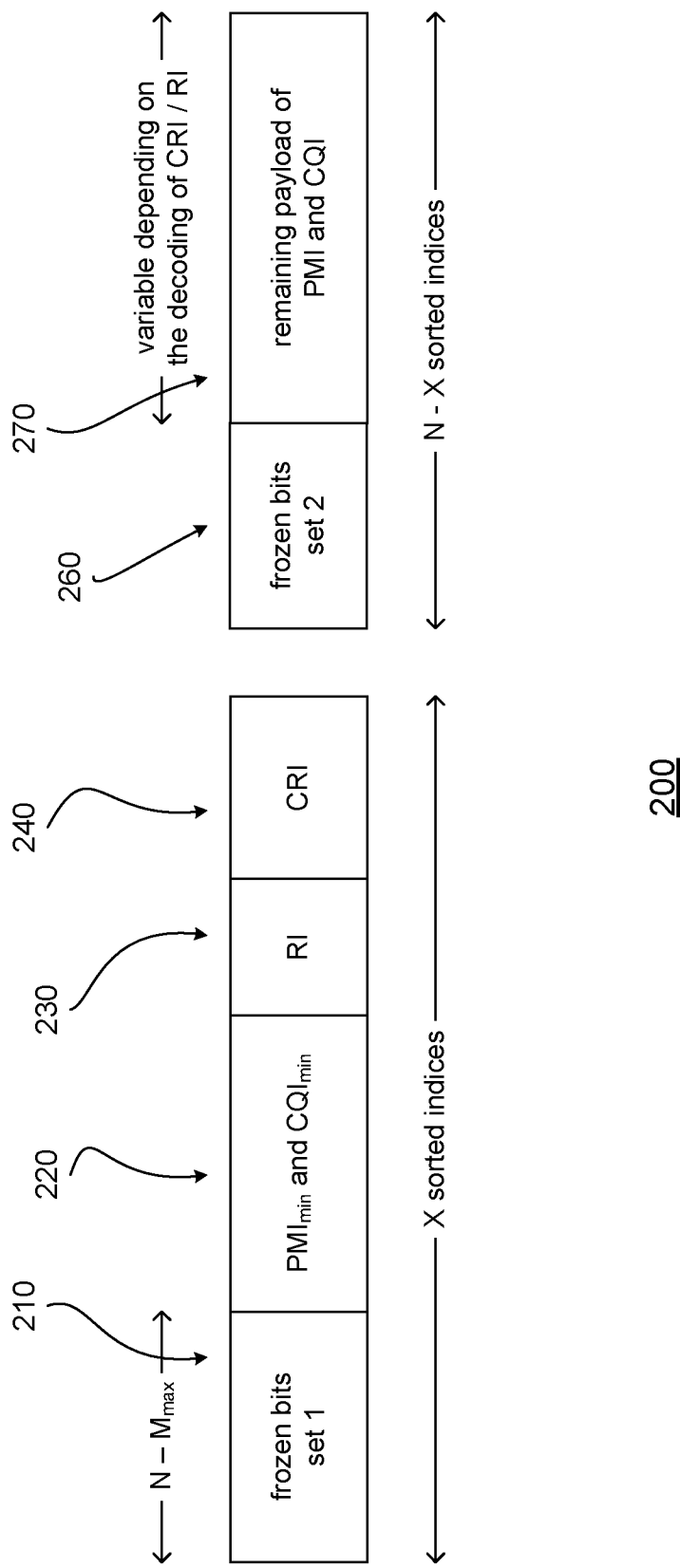
FIG. 2 illustrates a scenario of a transmission of different Channel State Information (CSI) components and parts thereof using polar codes in accordance with some embodiments of the disclosure.

FIG. 2 illustrates a scenario of a transmission of different CSI components and parts thereof using polar codes, in accordance with some embodiments of the disclosure. A scenario 200 may have a first CSI component and a second CSI component. The first CSI component may comprise a first set of zero-padding bits 210 (e.g., frozen bits), a minimum set of PMI bits and/or CQI bits 220, a set of RI bits 230, and a set of CRI bits 240. The second CSI component may comprise a second set of zero-padding bits 260 (e.g., frozen bits) and a remaining payload of PMI bits and/or CQI bits 270.

Accordingly, in various embodiments, for CSI encoding, a UE may first determine CSI to be transmitted. The CSI may comprise (and/or consist of) CRI, RI, PMI, CQI and a required number of bits. Note that some of the components for CSI (e.g., CRI) might not be present based on the network configuration.

For the first CSI component, based on a maximum CSI payload size $M_{MAX}$, the UE may determine a number of bits in a first set of zero-padding bits (e.g., frozen bits) as $N-M_{MAX}$, where N may be a polar code length (e.g., 512). Using fixed payload sizes of CRI and RI, and minimum payload sizes for PMI and CQI (which may be denoted as $PMI_{MIN}$ and $CQI_{MIN}$ respectively), the UE may determine a minimum possible payload size X for the first part of CSI for encoding.

For the second CSI component, a number of bits in a second set of zero-padding bits (e.g., frozen bits) may be determined from an actual CSI payload size (which may be denoted as $K_{CSI}$) and the number of bits in the first set of zero-padding bits and polar code block length as $N-(N-M_{MAX})-K_{CSI}=M_{MAX}-K_{CSI}$. For example, if an actual CSI payload size is at a maximum, the number of bits in the second set of zero-padding bits may be 0.

In some embodiments, either the first CSI component or the second CSI component may comprise Layer Indicator (LI) bits.

For a given polar code interleaving sequence of size N, the UE may first use X entries sorted based on bit quality to transmit some bits of PMI and CQI report (according to the minimum payload size of the CSI component) and all bits of RI and CRI report. The remaining N-X entries of the polar interleaving sequence may be used to transmit the remaining part of CSI (e.g., the remaining bits of PMI and CQI) For example, the minimum payload size for CQI may correspond to CQI corresponding to a first codeword (CW) if CSI reported by the UE corresponds to up to four MIMO layers (e.g., single CW), the remaining part of CQI might not be present and might not be transmitted, due to single codeword support. If CSI corresponds to more than four MIMO layers (e.g., two CW), the remaining part of CQI may correspond to the second CQI of the second codeword.

At a receiver end, a gNB may first decode X bits to determine CRI. RI, and a first part of a CQI/PMI payload, taking into account bits in the first set of zero-padding bits, and assuming part of bits in the second set of zero-padding bits, assuming maximum payload size for CSI. Based on the estimated CRI and RI values, the gNB may determine an actual pay load size for CSI, and may derive a remaining pay load size for CQI and PMI (which may be a variable number) and the actual number of bits in the second set of zero-padding bits, and may continue decoding of the remaining part of CSI taking this information into account.

Figure 3:
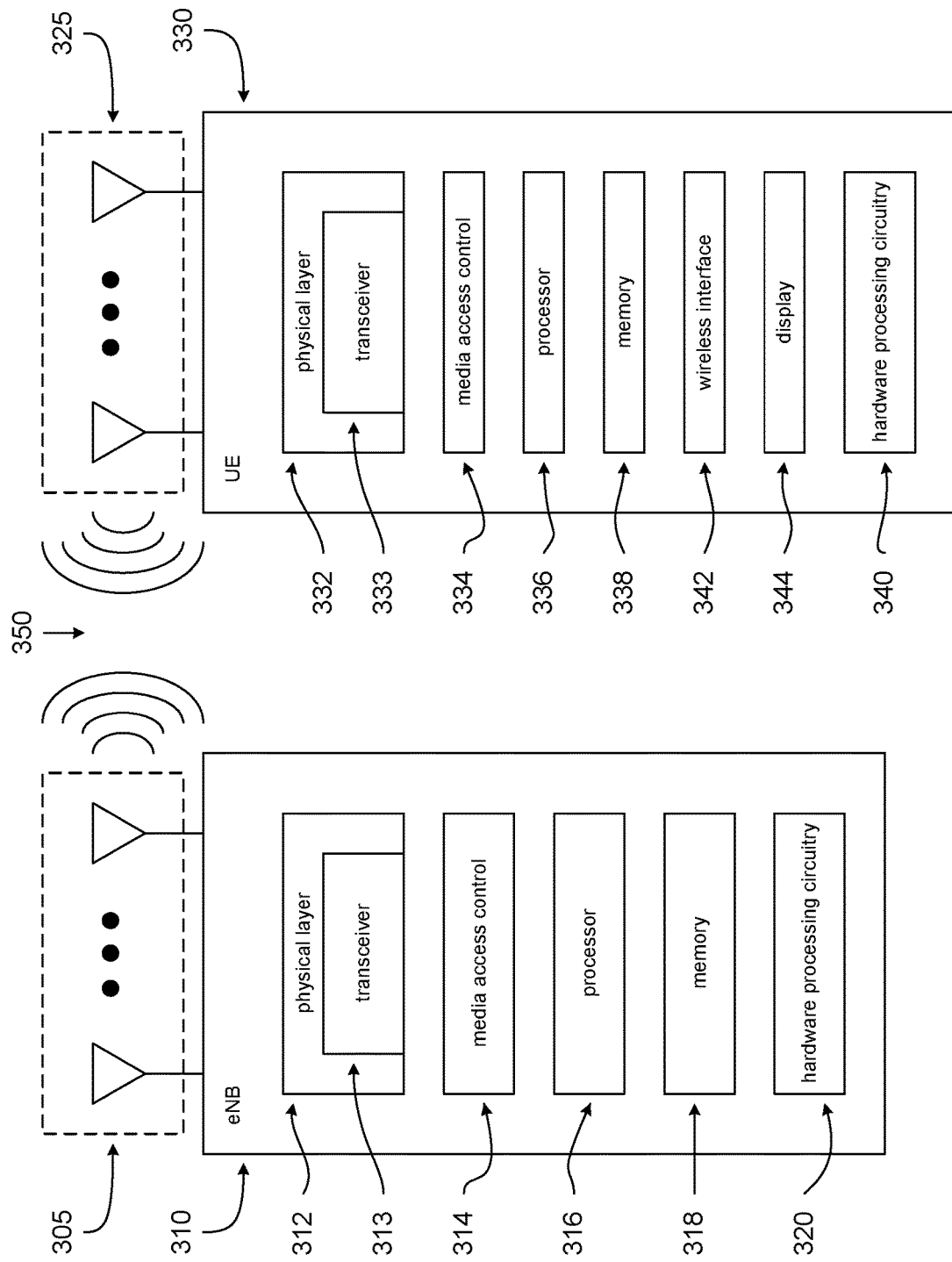
FIG. 3 illustrates an Evolved Node-B (eNB) and a UE, in accordance with some embodiments of the disclosure.

FIG. 3 illustrates an eNB and a UE, in accordance with some embodiments of the disclosure FIG. 3 includes block diagrams of an eNB 310 and a UE 330 which are operable to co-exist with each other and other elements of an LTE network. High-level, simplified architectures of eNB 310 and UE 330 are described so as not to obscure the embodiments. It should be noted that in some embodiments, eNB 310 may be a stationary non-mobile device.

eNB 310 is coupled to one or more antennas 305, and UE 330 is similarly coupled to one or more antennas 325. However, in some embodiments, eNB 310 may incorporate or comprise antennas 305, and UE 330 in various embodiments may incorporate or compose antennas 325.

In some embodiments, antennas 305 and/or antennas 325 may compose one or more directional or omni-directional antennas, including monopole antennas, dipole antennas, loop antennas, patch antennas, microstrip antennas, coplanar wave antennas, or other types of antennas suitable for transmission of RF signals. In some MIMO (multiple-input and multiple output) embodiments, antennas 305 are separated to take advantage of spatial diversity.

eNB 310 and UE 330 are operable to communicate with each other on a network, such as a wireless network eNB 310 and UE 330 may be in communication with each other over a wireless communication channel 350 which has both a Downlink (DL) path from eNB 310 to UE 330 and an Uplink (UL) path from UE 330 to eNB 310.

As illustrated in FIG. 3, in some embodiments, eNB 310 may include a physical layer circuitry 312, a MAC (media access control) circuitry 314, a processor 316, a memory 318, and a hardware processing circuitry 320. A person skilled in the art will appreciate that other components not shown may be used in addition to the components shown to form a complete eNB.

In some embodiments, physical layer circuitry 312 includes a transceiver 313 for providing signals to and from UE 330. Transceiver 313 provides signals to and from UEs or other devices using one or more antennas 305. In some embodiments, MAC circuitry 314 controls access to the wireless medium. Memory 318 may be, or may include, a storage media medium such as a magnetic storage media (e.g., magnetic tapes or magnetic disks), an optical storage media (e.g., optical discs), an electronic storage media (e.g., conventional hard disk drives, solid-state disk drives, or flash-memory-based storage media), or any tangible storage media or non-transitory storage media. Hardware processing circuitry 320 may comprise logic devices or circuitry to perform various operations. In some embodiments, processor 316 and memory 318 are arranged to perform the operations of hardware processing circuitry 320, such as operations described herein with reference to logic devices and circuitry within eNB 310 and/or hardware processing circuitry 320.

Accordingly, in some embodiments, eNB 310 may be a device comprising an application processor, a memory, one or more antenna ports, and an interface for allowing the application processor to communicate with another device.

As is also illustrated in FIG. 3, in some embodiments, UE 330 may include a physical layer circuitry 332, a MAC circuitry 334, a processor 336, a memory 338, a hardware processing circuitry 340, a wireless interface 342, and a display 344. A person skilled in the art would appreciate that other components not shown may be used in addition to the components shown to form a complete UE.

In some embodiments, physical layer circuitry 332 includes a transceiver 333 for providing signals to and from eNB 310 (as well as other eNBs). Transceiver 333 provides signals to and from eNBs or other devices using one or more antennas 325. In some embodiments, MAC circuitry 334 controls access to the wireless medium. Memory 338 may be, or may include, a storage media medium such as a magnetic storage media (e.g., magnetic tapes or magnetic disks), an optical storage media (e.g., optical discs), an electronic storage media (e.g., conventional hard disk drives, solid-state disk drives, or flash-memory-based storage media), or any tangible storage media or non-transitory storage media. Wireless interface 342 may be arranged to allow the processor to communicate with another device. Display 344 may provide a visual and/or tactile display for a user to interact with UE 330, such as a touch-screen display. Hardware processing circuitry 340 may comprise logic devices or circuitry to perform various operations. In some embodiments, processor 336 and memory 338 may be arranged to perform the operations of hardware processing circuitry 340, such as operations described herein with reference to logic devices and circuitry within UE 330 and/or hardware processing circuitry 340.

Accordingly, in some embodiments, UE 330 may be a device comprising an application processor, a memory one, or more antennas, a wireless interface for allowing the application processor to communicate with another device, and a touch-screen display.

Elements of FIG. 3, and elements of other figures having the same names or reference numbers, can operate or function in the manner described herein with respect to any such figures (although the operation and function of such elements is not limited to such descriptions). For example, FIGS. 4-5 and 8-9 also depict embodiments of eNBs, hardware processing circuitry of eNBs, UEs, and/or hardware processing circuitry of UEs, and the embodiments described with respect to FIG. 3 and FIGS. 4-5 and 8-9 can operate or function in the manner described herein with respect to any of the figures.

In addition, although eNB 310 and UE 330 are each described its having several separate functional elements, one or more of the functional elements may be combined and may be implemented by combinations of software-configured elements and/or other hardware elements. In some embodiments of this disclosure, the functional elements can refer to one or more processes operating on one or more processing elements. Examples of software and/or hardware configured elements include Digital Signal Processors (DSPs), one or more microprocessors, DSPs, Field-Programmable Gate Arrays (FPGAs), Application Specific Integrated Circuits (ASICs), Radio-Frequency Integrated Circuits (RFICs), and so on.

Figure 4:
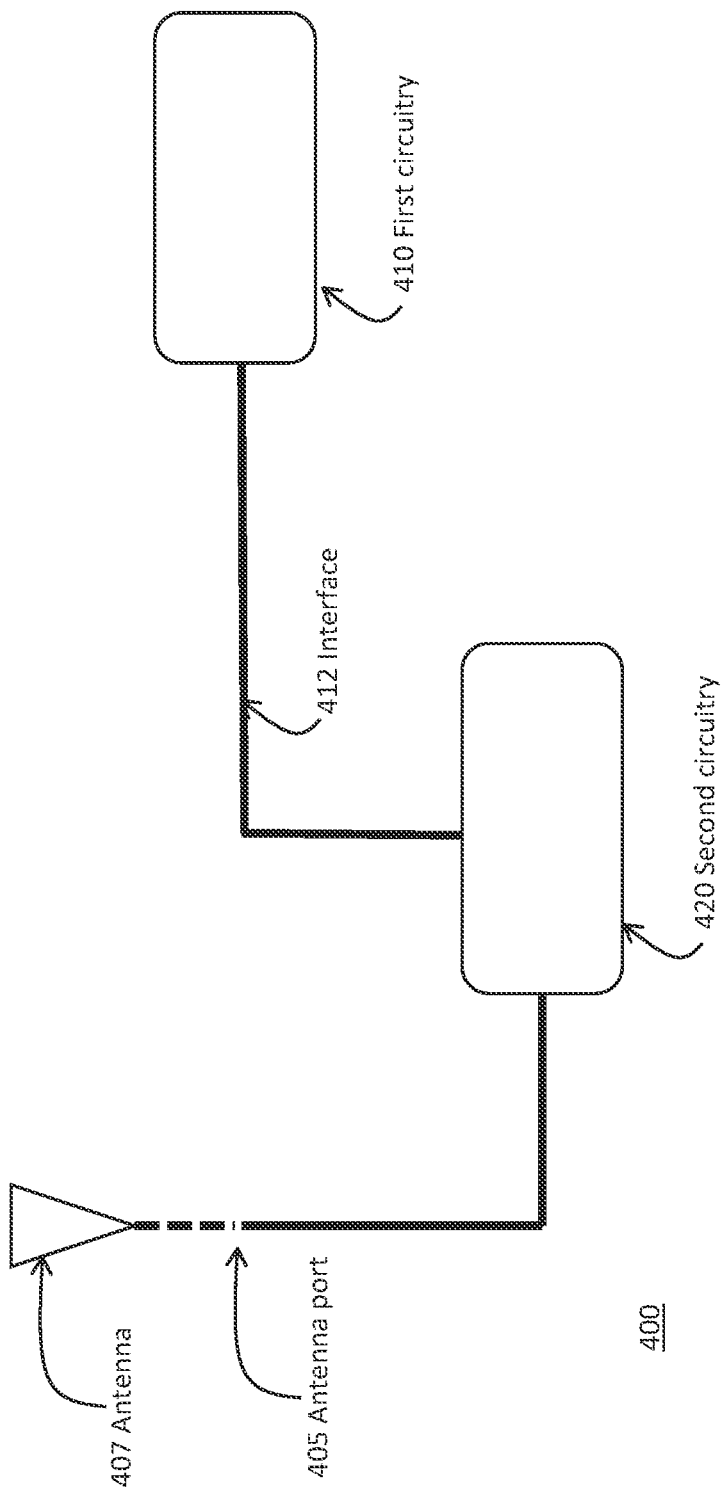
FIG. 4 illustrates hardware processing circuitries for a UE for Physical Downlink Shared Channel (PDSCH) starting symbol determination, in accordance with some embodiments of the disclosure.
Figure 5:
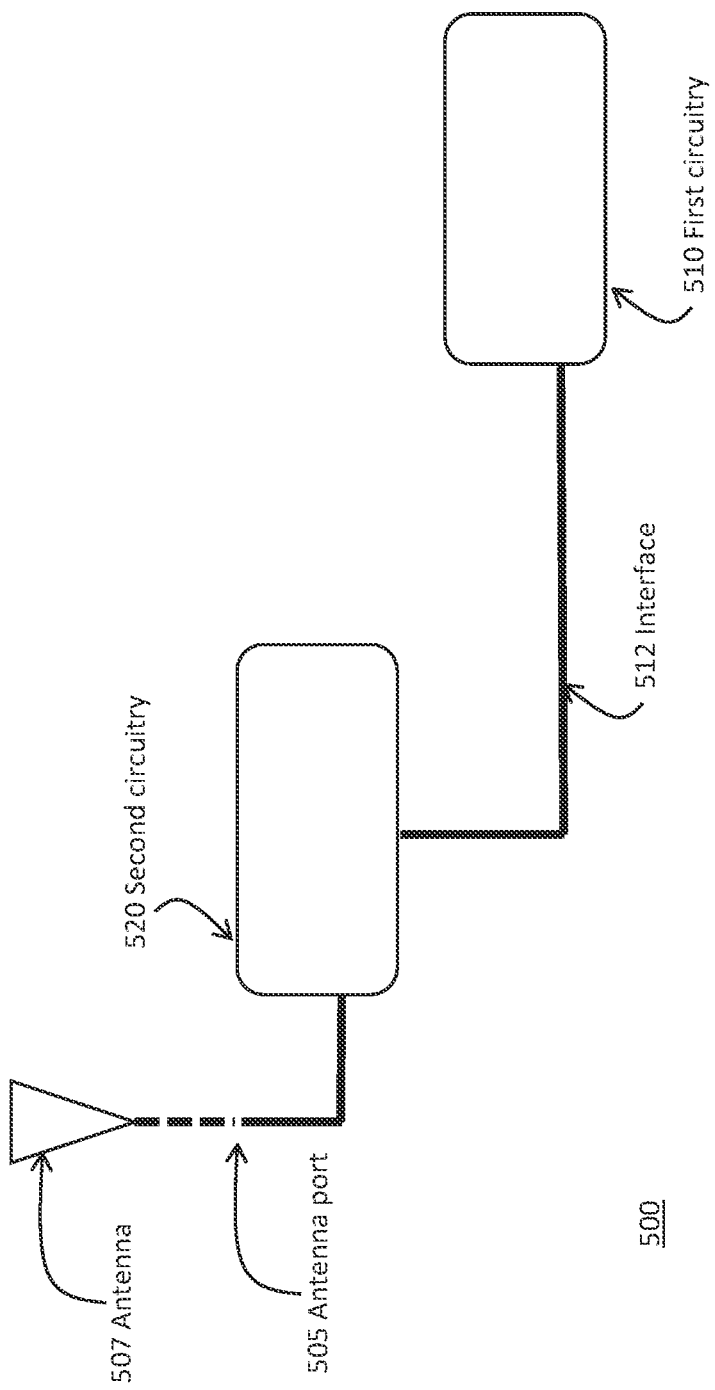
FIG. 5 illustrates hardware processing circuitries for a UE for common coding for CSI, in accordance with some embodiments of the disclosure.

FIG. 4 illustrates hardware processing circuitries for a UE for PDSCH starting symbol determination, in accordance with some embodiments of the disclosure. FIG. 5 illustrates hardware processing circuitries for a UE for common coding for CSI, in accordance with some embodiments of the disclosure. With reference to FIG. 3, a UE may include various hardware processing circuitries discussed herein (such as hardware processing circuitry 400 of FIG. 4 and hardware processing circuitry 500 of FIG. 5), which may in turn comprise logic devices and/or circuitry operable to perform various operations. For example, in FIG. 3 UE 330 (or various elements or components therein, such as hardware processing circuits 340, or combinations of elements or components therein) may include part of, or all of, these hardware processing circuitries.

In some embodiments, one or more devices or circuitries within these hardware processing circuitries may be implemented by combinations of software-configured elements and/or other hardware elements. For example, processor 336 (and/or one or more other processors which UE 330 may comprise), memory 338, and/or other elements or components of UE 330 (which may include hardware processing circuitry 340) may be arranged to perform the operations of these hardware processing circuitries, such as operations described herein with reference to devices and circuitry within these hardware processing circuitries. In some embodiments, processor 336 (and/or one or more other processors which UE 330 may comprise) may be a baseband processor.

Returning to FIG. 4, an apparatus of UE 330 (or another UE or mobile handset), which may be operable to communicate with one or more eNBs on a wireless network, may comprise hardware processing circuitry 400. In some embodiments, hardware processing circuitry 400 may comprise one or more antenna ports 405 operable to provide various transmissions over a wireless communication channel (such as wireless communication channel 350.) Antenna ports 405 may be coupled to one or more antennas 407 (which may be antennas 325). In some embodiments, hardware processing circuitry 400 may incorporate antennas 407, while in other embodiments, hardware processing circuitry 400 may merely be coupled to antennas 407.

Antenna ports 405 and antennas 407 may be operable to provide signals from a UE to a wireless communications channel and/or an eNB, and may be operable to provide signals from an eNB and/or a wireless communications channel to a UE. For example, antenna ports 405 and antennas 407 may be operable to provide transmissions from UE 330 to wireless communication channel 350 (and from there to eNB 310, or to another eNB). Similarly, antennas 407 and antenna ports 405 may be operable to provide transmissions from a wireless communication channel 350 (and beyond that, from eNB 310, or another eNB) to UE 330.

Hardware processing circuitry 400 may comprise various circuitries operable in accordance with the various embodiments discussed herein. With reference to FIG. 4, hardware processing circuitry 400 may comprise a first circuitry 410 and/or a second circuitry 420.

First circuitry 410 may be operable to determine a first parameter set and a second parameter set for establishing PDSCH resources. Second circuitry 420 may be operable to process a first part of a PDSCH transmission from a first set of MIMO layers corresponding with a first MBSFN configuration based on the first parameter set. Second circuitry 420 may also be operable to process a second part of the PDSCH transmission from a second set of MIMO layers corresponding with a second MBSFN configuration based on the second parameter set. First circuitry 410 may be operable to provide information regarding the first parameter set and/or the second parameter set to second circuitry 420 via an interface 412. Hardware processing circuitry 400 may comprise an interface for receiving the PDSCH transmission from a receiving circuitry.

In some embodiments, second circuitry 420 may be operable to process a configuration transmission carrying at least one of the first parameter set and the second parameter set.

For some embodiments, a scheduled DL subframe may be an MBSFN subframe for the first parameter set and a non-MBSFN subframe for the second parameter set. In some embodiments, a starting PDSCH OFDM symbol index of the PDSCH transmission may be the minimum of: two; or a starting PDSCH symbol index of the first parameter set. For some embodiments, a starting PDSCH OFDM symbol index of the PDSCH transmission, a starting PDSCH symbol index of the first parameter set, and a starting PDSCH symbol index of the second parameter set may be the same value.

In some embodiments, first circuitry 410 and/or second circuitry 420 may be implemented as separate circuitries. In other embodiments, first circuitry 410 and/or second circuitry 420 may be combined and implemented together in a circuitry without altering the essence of the embodiments.

Returning to FIG. 5, an apparatus of UE 330 (or another UE or mobile handset), which may be operable, to communicate with one or more eNBs on a wireless network, may comprise hardware processing circuitry 500. In some embodiments, hardware processing circuitry 500 may comprise one or more antenna ports 505 operable to provide various transmissions over a wireless communication channel (such as wireless communication channel 350). Antenna ports 505 may be coupled to one or more antennas 507 (which may be antennas 325). In some embodiments, hardware processing circuitry 500 may incorporate antennas 507, while in other embodiments, hardware processing circuitry 500 may merely be coupled to antennas 507.

Antenna ports 505 and antennas 507 may be operable to provide signals from a UE to a wireless communications channel and/or an eNB, and may be operable to provide signals from an eNB and/or a wireless communications channel to a UE. For example, antenna ports 505 and antennas 507 may be operable to provide transmissions from UE 330 to wireless communication channel 350 (and from there to eNB 310 or to another eNB). Similarly, antennas 507 and antenna ports 505 may be operable to provide transmissions from a wireless communication channel 350 (and beyond that from eNB 310, or another eNB) to UE 330.

Hardware processing circuitry 500 may comprise various circuitries operable in accordance with the various embodiments discussed herein. With reference to FIG. 5, hardware processing circuitry 500 may comprise a first circuitry 510 and/or a second circuitry 520.

First circuitry 510 may be operable to establish a first CSI component of a CSI transmission pay load, the first CSI component having a predetermined number of bits, and the first CSI component corresponding to a first number of zero-padding bits. First circuitry 510 may also be operable to establish a second CSI component of the CSI transmission payload, the second CSI component having a number of bits based upon a total size in bits of the CSI transmission payload, and the second CSI component corresponding to a second number of zero-padding bits. Second circuitry 520 may be operable to encode a polar-coded CSI transmission carrying the first number of zero-padding bits, the first CSI component, the second number of zero-padding bits, and the second CSI component. First circuitry 510 may be operable to provide information regarding the first CSI component of the CSI transmission payload, the first number of zero-padding bits, the second CSI component of the CSI transmission payload, and/or the second number of zero-padding bits to second circuitry 520 via an interface 512. Hardware processing circuitry 500 may comprise an interface for sending the polar-coded CSI transmission to a transmission circuitry.

In some embodiments, first circuitry 510 may also be operable to calculate the size in bits of the CSI transmission payload.

For some embodiments, the first number of zero-padding bits may be set at the difference between a mother code length of a corresponding polar code in bits and a maximum CSI payload size in bits. In some embodiments, the encoding of the polar-coded CSI transmission may be performed by mapping the first CSI component to a set of most reliable entries of a polar encoder among a subset of entries corresponding with the first CSI component and the encoding of the polar-coded CSI transmission may also be performed by mapping she second CSI component to a set of most reliable entries of a polar encoder among a subset of entries corresponding with the second CSI component.

For some embodiments, the subset of entries corresponding with the first CSI component may comprise a number N1 of polar encoder entries corresponding with first-decoded bits, with N1 being a sum of a number of bits of the first CSI component and the first number of zero-padding bits, and the subset of entries corresponding with the second CSI component may comprise a number N2 of polar encoder entries, with N2 being a sum of a number of bits of the second CSI component and the second number of zero-padding bits.

In some embodiments, an actual CSI pay load size in bits may be a sum of a number of bits of the first CSI component and a number of bits of the second CSI component, and the second number of zero-padding bits may be set at the difference between the maximum CSI payload size in bits and the actual CSI payload size in bits. For some embodiments, the first CSI component may include one or more of: a minimum number of PMI bits; a minimum number of CQI bits; a number of RI bits; a minimum number of LI bits; or a number of CRI bits. In some embodiments, the second CSI component may include one or more of a remaining number of PMI bits; a remaining number of CQI bits; or a remaining number of LI bits.

In some embodiments, first circuitry 510 and/or second circuitry 520 may be implemented as separate circuitries. In other embodiments, first circuitry 510 and/or second circuitry 320 may be combined and implemented together in a circuitry without altering the essence of the embodiments.

Figure 6:
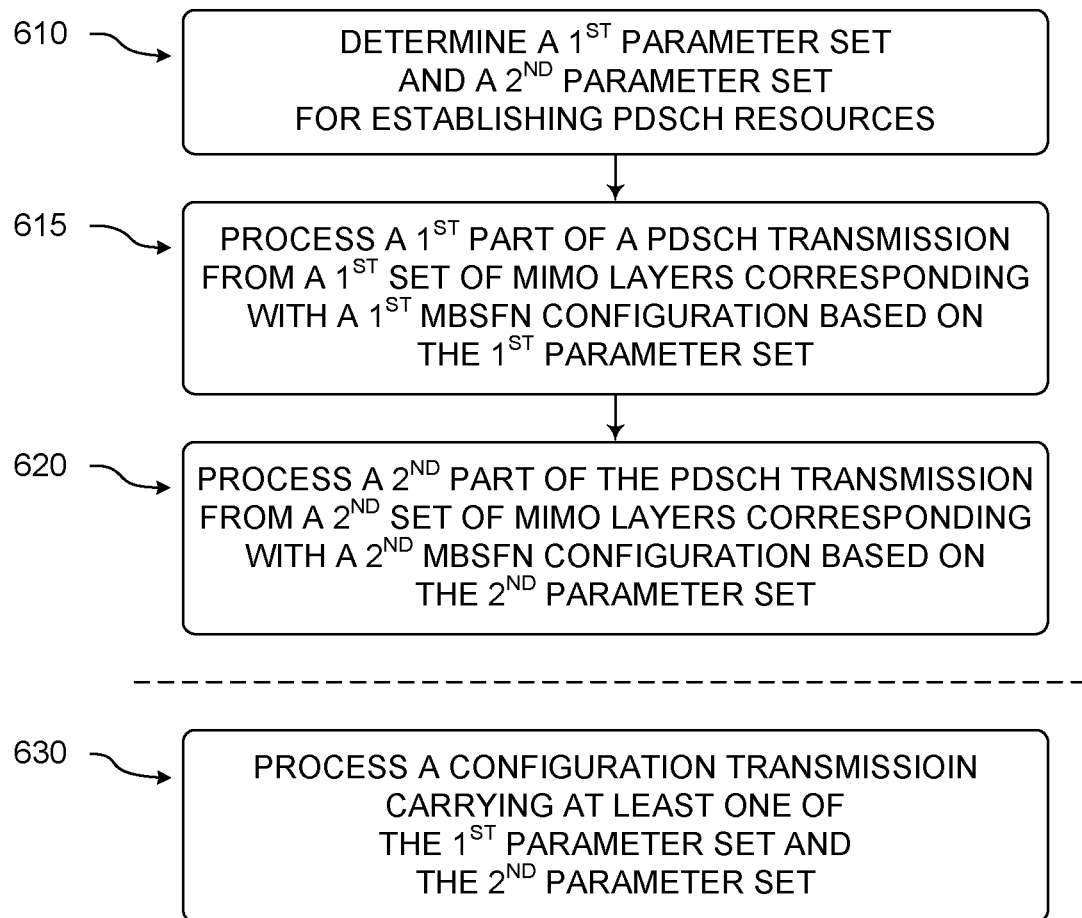
FIG. 6 illustrates methods for a UE for PDSCH starting symbol determination, in accordance with some embodiments of the disclosure.
Figure 7:
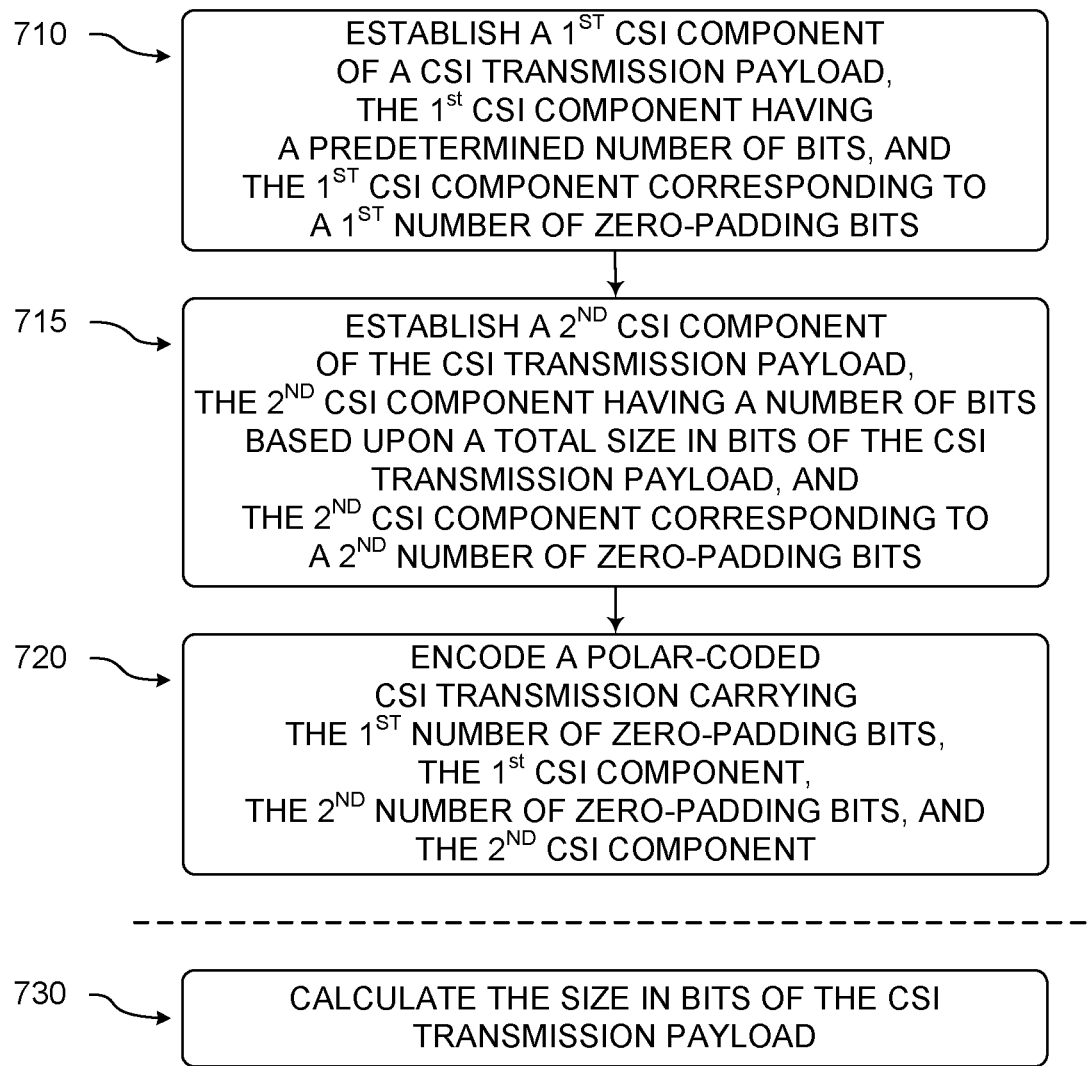
FIG. 7 illustrates methods for a UE for common coding for CSI, in accordance with some embodiments of the disclosure.

FIG. 6 illustrates methods for a UE for PDSCH starting symbol determination, in accordance with some embodiments of the disclosure. FIG. 7 illustrates methods for a UE for common coding for CSI, in accordance with some embodiments of the disclosure. With reference to FIG. 3, methods that may relate to UE 330 and hardware processing circuitry 340 are discussed herein. Although the actions in method 600 of FIG. 6 and method 700 of FIG. 7 are shown in a particular order, the order of the actions can be modified.

Thus, the illustrated embodiments can be performed in a different order, and some actions may be performed in parallel. Some of the actions and/or operations listed in FIGS. 6 and 7 are optional in accordance with certain embodiments. The numbering of the actions presented is for the sake of clarity and is not intended to prescribe an order of operations in which the various actions must occur. Additionally, operations from the various flows may be utilized in a variety of combinations.

Moreover, in some embodiments, machine readable storage media may have executable instructions that, when executed, cause UE 330 and/or hardware processing circuitry 340 to perform an operation comprising the methods of FIGS. 6 and 7. Such machine readable storage media may include any of a variety of storage media, like magnetic storage media (e.g., magnetic tapes or magnetic disks), optical storage media (e.g., optical discs), electronic storage media (e.g., conventional hard disk drives, solid-state disk drives, or flash-memory-based storage media), or any other tangible storage media or non-transitory storage media.

In some embodiments, an apparatus may comprise means for performing various actions and/or operations of the methods of FIGS. 6 and 7.

Returning to FIG. 6, various methods may be in accordance with the various embodiments discussed herein. A method 600 may comprise a determining 610, a processing 615, and a processing 620. Method 600 may also comprise a processing 630.

In determining 610, a first parameter set and a second parameter set for establishing PDSCH resources may be determined. In processing 615, a first part of a PDSCH transmission from a first set of MIMO layers corresponding with a first MBSFN configuration based on the first parameter set may be processed, in processing 620, a second part of the PDSCH transmission from a second set of MIMO layers corresponding with a second MBSFN configuration based on the second parameter set may be processed.

In some embodiments, in processing 630, a configuration transmission carrying at least one of the first parameter set and the second parameter set may be processed.

For some embodiments, a scheduled DL subframe may be an MBSFN subframe for the first parameter set and a non-MBSFN subframe for the second parameter set. In some embodiments, a starting PDSCH OFDM symbol index of the PDSCH transmission may be the minimum of: two; or a starting PDSCH symbol index of the first parameter set. For some embodiments, a starting PDSCH OFDM symbol index of the PDSCH transmission, a starting PDSCH symbol index of the first parameter set, and a starting PDSCH symbol index of the second parameter set may be the same value.

Returning to FIG. 7, various methods may be in accordance with the various embodiments discussed herein. A method 700 may comprise an establishing 710, an establishing 715, and an encoding 720. Method 700 may also comprise a calculating 730.

In establishing 710, a first CSI component of a CSI transmission pay load may be established, the first CSI component having a predetermined number of bits, and the first CSI component corresponding to a first number of zero-padding bits. In establishing 715, a second CSI component of she CSI transmission payload may be established, the second CSI component having a number of bits based upon a total size in bits of the CSI transmission payload, and the second CSI component corresponding to a second number of zero-padding bits. In encoding 720, a polar-coded CSI transmission carrying the first number of zero-padding bits, the first CSI component, the second number of zero-padding bits, and the second CSI component may be encoded.

In some embodiments, in calculating 730, the size in bits of the CSI transmission payload may be calculated.

For some embodiments, the first number of zero-padding bits may be set at the difference between a mother code length of a corresponding polar code in bits and a maximum CSI pay load size in bits. In some embodiments, the encoding of the polar-coded CSI transmission may be performed by mapping the first CSI component to a set of most reliable entries of a polar encoder among a subset of entries corresponding with the first CSI component, and the encoding of the polar-coded CSI transmission may also be performed by mapping tire second CSI component to a set of most reliable entries of a polar encoder among a subset of entries corresponding with the second CSI component.

For some embodiments, the subset of entries corresponding with the first CSI component may comprise a number N1 of polar encoder entries corresponding with first-decoded bits, with N1 being a sum of a number of bits of the first CSI component and the first number of zero-padding bits, and the subset of entries corresponding with the second CSI component may comprise a number N2 of polar encoder entries, with N2 being a sum of a number of bits of the second CSI component and the second number of zero-padding bits.

In some embodiments, an actual CSI payload size in bits may be a sum of a number of bits of the first CSI component and a number of bits of the second CSI component, and the second number of zero-padding bits may be set at the difference between the maximum CSI payload size in bits and the actual CSI pay load size in bits. For some embodiments, the first CSI component may include one or more of: a minimum number of PMI bits; a minimum number of CQI bits; a number of RI bits; a minimum number of LI bits; or a number of CRI bits. In some embodiments, the second CSI component may include one or more of: a remaining number of PMI bits; a remaining number of CQI bits; or a remaining number of LI bits.

Figure 8:
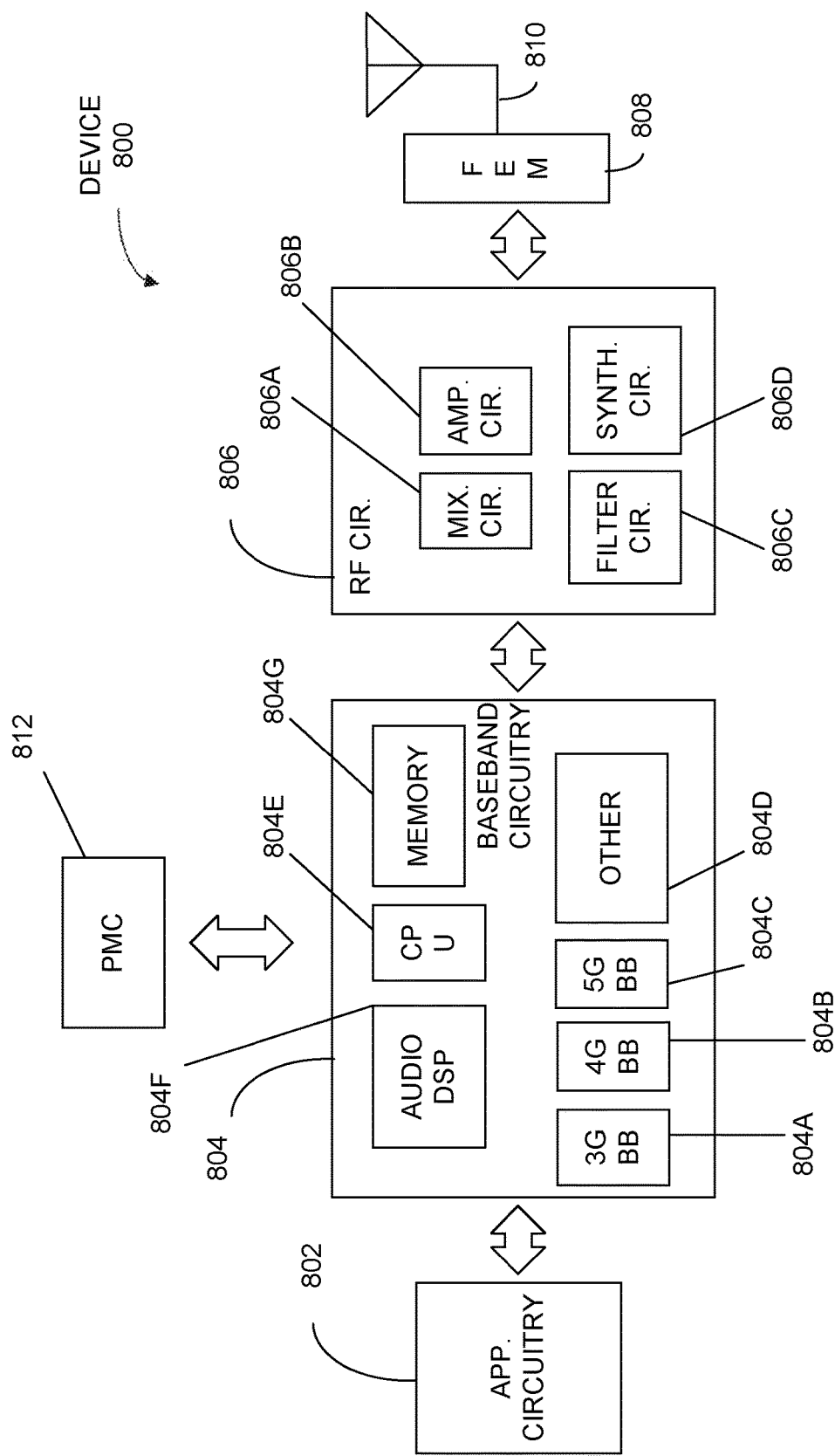
FIG. 8 illustrates example components of a device, in accordance with some embodiments of the disclosure.

FIG. 8 illustrates example components of a device, in accordance with some embodiments of the disclosure. In some embodiments, the device 800 may include application circuitry 802, baseband circuitry 804, Radio Frequency (RF) circuitry 806, front-end module (FEM) circuitry 808, one or more antennas 810, and power management circuitry (PMC) 812 coupled together at least as shown. The components of the illustrated device 800 may be included in a UE or a RAN node. In some embodiments, the device 800 may include less elements (e.g., a RAN node may not utilize application circuitry 802, and instead include a processor controller to process IP data received from an EPC). In some embodiments, the device 800 may include additional elements such as, for example, memory storage, display, camera, sensor, or input/output (I/O) interface. In other embodiments, the components described below may be included in more than one device (e.g., sand circuitries may be separately included m more than one device for Cloud-RAN (C-RAN) implementations).

The application circuitry 802 may include one or more application processors. For example, the application circuitry 802 may include circuitry such as, but not limited to, one or more single-core or multi-core processors. The processor(s) may include any combination of general-purpose processors and dedicated processors (e.g., graphics processors, application processor, and so on). The processors may be coupled with or may include memory storage and may be configured to execute instructions stored in the memory/storage to enable various applications or operating systems to run on the device 800. In some embodiments, processors of application circuitry 802 may process IP data packets received from an EPC.

The baseband circuitry 804 may include circuitry such as, but not limited to, one or more single-core or multi-core processors. The baseband circuitry 804 may include one or more baseband processors or control logic to process baseband signals received from a receive signal path of the RF circuitry 806 and to generate baseband signals for a transmit signal path of the RF circuitry 806. Baseband processing circuitry 804 may interface with the application circuitry 802 for generation and processing of tire baseband signals and for controlling operations of the RF circuitry 806. For example, in some embodiments, the baseband circuitry 804 may include a third generation (3G) baseband processor 804A, a fourth generation (4G) baseband processor 804B, a fifth generation (5G) baseband processor 804C, or other baseband processor(s) 804D for other existing generations, generations in development or to be developed in the future (e.g., second generation 2G), sixth generation (6G), and so on). The baseband circuitry 804 (e.g., one or more of baseband processors 804A-D) may handle various radio control functions that enable communication with one or more radio networks via the RF circuitry 806. In other embodiments, some or all of the functionality of baseband processors 804A-D may be included in modules stored in the memory 804G and executed via a Central Processing Unit (CPU) 804E. The radio control functions may include, but are not limited to, signal modulation/demodulation, encoding/decoding, radio frequency shifting, and so on. In some embodiments, modulation/demodulation circuitry of the baseband circuitry 804 may include Fast-Fourier Transform (FFT), precoding, or constellation mapping/demapping functionality. In some embodiments, encoding/decoding circuitry of the baseband circuitry 804 may include convolution, tail-biting convolution, turbo, Viterbi, or Low Density Parity Check (LDPC) encoder/decoder functionality. Embodiments of modulation/demodulation and encoder/decoder functionality are not limited to these examples and may include other suitable functionality in other embodiments.

In some embodiments, the baseband circuitry 804 may include one or more audio digital signal processor(s) (DSP) 804F. The audio DSP(s) 804F may include elements for compression/decompression and echo cancellation and may include other suitable processing elements in other embodiments. Components of the baseband circuitry may be suitably combined in a single chip, a single chipset, or disposed on a same circuit board in some embodiments. In some embodiments, some or all of the constituent components of the baseband circuitry 804 and the application circuitry 802 may be implemented together such as, for example, on a system on a chip (SOC).

In some embodiments, the baseband circuitry 804 may provide for communication compatible with one or more radio technologies. For example, in some embodiments, the baseband circuitry 804 may support communication with an evolved universal terrestrial radio access network (EUTRAN) or other wireless metropolitan area networks (WMAN), a wireless local area network (WLAN), a wireless personal area network (WPAN). Embodiments in which the baseband circuitry 804 is configured to support radio communications of more than one wireless protocol may be referred to as multi-mode baseband circuitry.

RF circuitry 806 may enable communication with wireless networks using modulated electromagnetic radiation through a non-solid medium. In various embodiments, the RF circuitry 806 may include switches, filters, amplifiers, and so on to facilitate the communication with the wireless network. RF circuitry 806 may include a receive signal path which may include circuitry to down-convert RF signals received from the FEM circuitry 808 and provide baseband signals to the baseband circuitry 804. RF circuitry 806 may also include a transmit signal path which may include circuitry to up-convert baseband signals provided by the baseband circuitry 804 and provide RF output signals so the FEM circuitry 808 for transmission.

In some embodiments, the receive signal path of the RF circuitry 806 may include mixer circuitry 806A, amplifier circuitry 806B and filter circuitry 806C. In some embodiments, the transmit signal path of the RF circuitry 806 may include filter circuitry 806C and mixer circuitry 806A. RF circuits 806 may also include synthesizer circuitry 806D for synthesizing a frequency for use by the mixer circuitry 806A of the receive signal path and the transmit signal path. In some embodiments, the mixer circuitry 806A of the receive signal path may be configured to down-convert RF signals received from the FEM circuitry 868 based on the synthesized frequency provided by synthesizer circuitry 806D. The amplifier circuitry 806B may be configured to amplify the down-converted signals and the filter circuitry 806C may be a low-pass filler (LPF) or band-pass filter (BPF) configured to remove unwanted signals from the down-converted signals to generate output baseband signals. Output baseband signals may be provided to the baseband circuitry 804 for further processing. In some embodiments, the output baseband signals may be zero-frequency baseband signals, although this is not a requirement In some embodiments, mixer circuitry 806A of the receive signal path may comprise passive mixers, although the scope of the embodiments is not limited in this respect.

In some embodiments, the mixer circuitry 806A of the transmit signal path may be configured to up-convert input baseband signals based on the synthesized frequency provided by the synthesizer circuitry 806D to generate RF output signals for the FEM circuitry 808. The baseband signals may be provided by the baseband circuitry 804 and may be filtered by filter circuitry 806C.

In some embodiments, the mixer circuitry 806A of the receive signal path and the mixer circuitry 806A of the transmit signal path may include two or more mixers and may be arranged tor quadrature downconversion and upconversion, respectively. In some embodiments, the mixer circuitry 806A of the receive signal path and the mixer circuitry 806A of the transmit signal path may include two or more mixers and may be arranged for image rejection (e.g., Hartley image rejection). In some embodiments, the mixer circuitry 806A of the receive signal path and the mixer circuitry 806A may be arranged for direct downconversion and direct upconversion, respectively. In some embodiments, the mixer circuitry 806A of the receive signal path and the mixer circuitry 806A of the transmit signal path may be configured for super-heterodyne operation.

In some embodiments, the output baseband signals and the input baseband signals may be analog baseband signals, although the scope of the embodiments is not limited in this respect. In some alternate embodiments, the output baseband signals and the input baseband signals may be digital baseband signals. In these alternate embodiments, the RF circuitry 806 may include analog-to-digital converter (ADC) and digital-to-analog converter (DAC) circuitry and the baseband circuits 804 may include a digital baseband interface to communicate with the RF circuitry 806.

In some dual-mode embodiments, a separate radio IC circuitry may be provided for processing signals for each spectrum, although the scope of the embodiments is not limited in this respect.

In some embodiments, the synthesizer circuitry 806D may be a fractional-N synthesizer or a fractional N/N+1 synthesizer, although the scope of the embodiments is not limited in this respect as other types of frequency synthesizers may be suitable. For example, synthesizer circuitry 8060 may be a delta-sigma synthesizer, a frequency multiplier, or a synthesizer comprising a phase-locked loop with a frequency divider.

The synthesizer circuitry 806D may be configured to synthesize an output frequency for use by the mixer circuitry 806A of the RF circuity 806 based on a frequency input and a divider control input. In some embodiments, the synthesizer circuitry 806D may be a fractional N/N+1 synthesizer.

In some embodiments, frequency input may be provided by a voltage controlled oscillator (VCO), although that is not a requirement. Divider control input may be provided by either the baseband circuitry 804 or the applications processor 802 depending on the desired output frequency. In some embodiments, a divider control input (e.g., N) may be determined from a look-up table based on a channel indicated by the applications processor 802.

Synthesizer circuitry 806D of the RF circuitry 806 may include a divider, a delay-locked loop (DLL), a multiplexer and a phase accumulator. In some embodiments, the divider may be a dual modulus divider (DMD) and the phase accumulator may be a digital phase accumulator (DPA). In some embodiments, the DMD stay be configured to divide the input signal by either N or N+1 (e.g., based on a carry out) to provide a fractional division ratio. In some example embodiments, the DLL may include a set of cascaded, tunable, delay elements, a phase detector, a charge pump and a D-type flip-flop. In these embodiments, the delay elements may be configured to break a VCO period up into Nd equal packets of phase, where Nd is the number of delay elements in the delay line. In this way, the DLL provides negative feedback to help ensure that the total delay through the delay line is one VCO cycle.

In some embodiments, synthesizer circuitry 806D may be configured to generate a carrier frequency as the output frequency, while in other embodiments, the output frequency may be a multiple of the carrier frequency (e.g., twice the earner frequency, four times the carrier frequency) and used in conjunction with quadrature generator and divider circuitry to generate multiple signals at the carrier frequency with multiple different phases with respect to each other. In some embodiments, the output frequency may be a LO frequency (fLO). In some embodiments, the RF circuitry 806 may include an IQ/polar converter.

FEM circuitry 808 may include a receive signal path which may include circuitry configured to operate on RF signals received from one or more antennas 810, amplify the received signals and provide the amplified versions of the received signals to the RF circuitry 806 for further processing. FEM circuitry 808 may also include a transmit signal path which may include circuitry configured to amplify signals for transmission provided by the RF circuitry 806 for transmission by one or more of the one or more antennas 81. In various embodiments, the amplification through the transmit or receive signal paths may be done solely in the RF circuitry 806, solely in the FEM 808, or in both the RF circuitry 806 and the FEM 808.

In some embodiments, the FEM circuitry 808 may include a TX/RX switch to switch between transmit mode and receive mode operation. The FEM circuitry may Include a receive signal path and a transmit signal path. The receive signal path of the FEM circuitry may include an LNA to amplify received RF signals and provide the amplified received RF signals as an output (e.g., to the RF circuitry 806). The transmit signal path of the FEM circuitry 808 may include a power amplifier (PA) to amplify input RF signals (e.g., provided by RF circuitry 806), and one or more filters to generate RF signals for subsequent transmission (e.g., by one or more of the one or more antennas 810).

In some embodiments, the PMC 812 may manage power provided to the baseband circuitry 804. In particular, the PMC 812 may control power-source selection, voltage scaling, battery charging, or DC-to-DC conversion. The PMC 812 may often be included when the device 800 is capable of being powered by a battery, for example, when the device is included in a UE. The PMC 812 may increase the power conversion efficiency while providing desirable implementation size and heat dissipation characteristics.

While FIG. 8 shows the PMC 812 coupled only with the baseband circuitry 804. However, in other embodiments, the PMC 812 may be additionally or alternatively coupled with, and perform similar power management operations for, other components such as, but not limited to, application circuitry 802, RF circuitry 806, or FEM 808.

In some embodiments, the PMC 812 may control, or otherwise be part of, various power saving mechanisms of the device 800. For example, if the device 800 is in an RRC_Connected state, where it is still connected to the RAN node as it expects to receive traffic shortly, then it may enter a state known as Discontinuous Reception Mode (DRX) after a period of inactivity. During this state, the device 800 may power down for brief intervals of time and thus save power.

If there is no data traffic activity for an extended period of time, then the device 800 may transition off to an RRC_Idle state, where it disconnects from the network and does not perform operations such as channel quality feedback, handover, and so on. The device 800 goes into a very low power state and it performs paging where again it periodically wakes up to listen to the network and then powers down again. The device 800 may not receive data in this state, in order to receive data, it must transition back to RRC_Connected state.

An additional power saving mode may allow a device to be unavailable to the network for periods longer than a paging interval (ranging from seconds to a few hours). During this time, the device is totally unreachable to the network and may power down completely. Any data sent during this time incurs a large delay and it is assumed the delay is acceptable.

Processors of the application circuitry 802 and processors of the baseband circuitry 804 may be used to execute elements of one or more instances of a protocol stack. For example, processors of the baseband circuitry 804, alone or in combination, may be used execute Layer 3, Layer 2, or Layer 1 functionality, while processors of the application circuitry 804 may utilize data (e.g., packet data) receiver from these layers and further execute Layer 4 functionality (e.g., transmission communication protocol (TCP) and user datagram protocol (UDP) layers). As referred to herein. Layer 3 may comprise a radio resource control (RRC) layer, described in further detail below. As referred to herein, Layer 2 may comprise a medium access control (MAC) layer, a radio link control (RLC) layer, and a packet data convergence protocol (PDCP) layer, described in further detail below. As referred to herein, Layer 1 may comprise a physical (PHY) layer of a UE/RAN node, described in further detail below.

Figure 9:
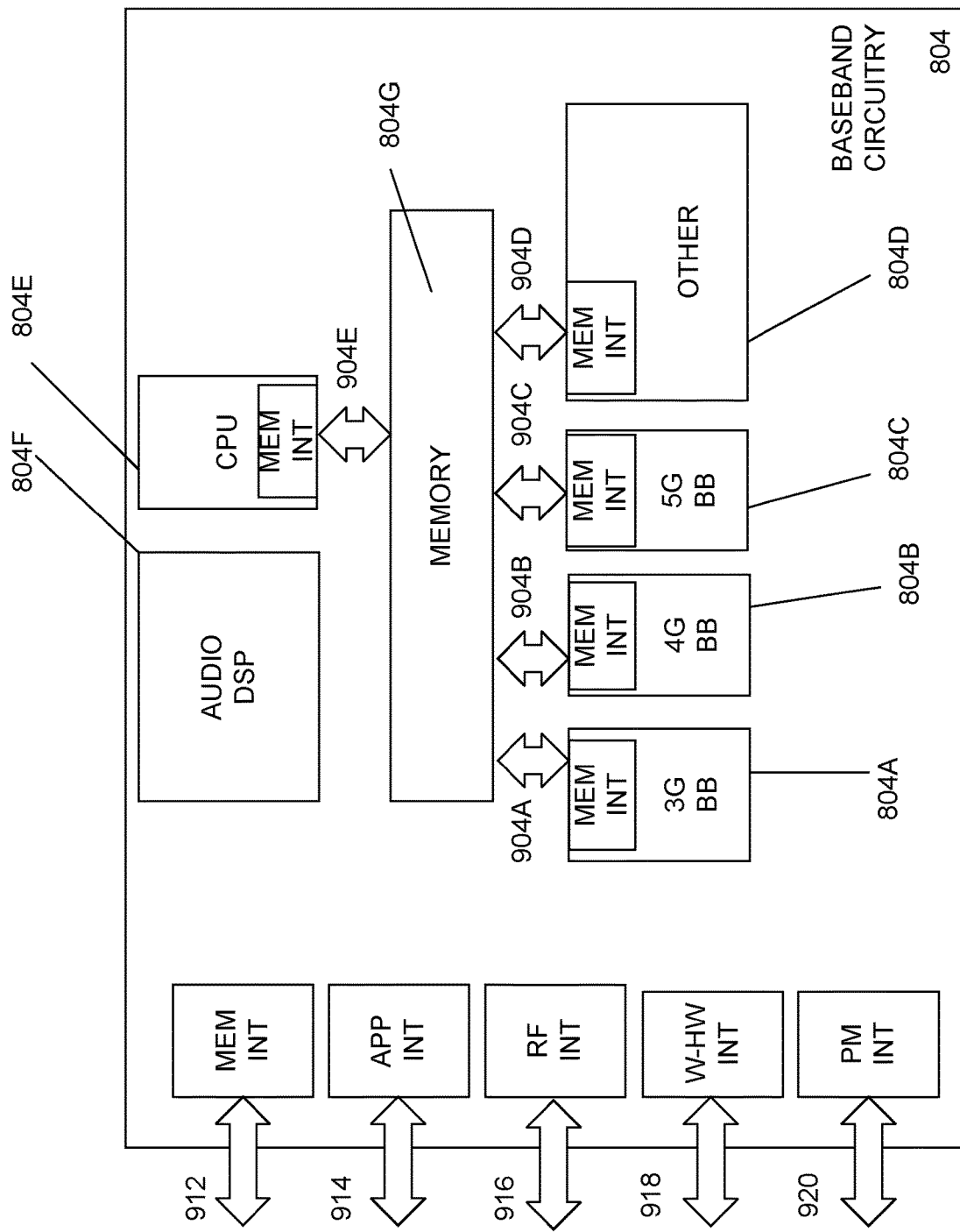
FIG. 9 illustrates example interfaces of baseband circuitry, in accordance with some embodiments of the disclosure.

FIG. 9 illustrates example interfaces of baseband circuitry, in accordance with some embodiments of the disclosure. As discussed above the baseband circuitry 804 of FIG. 8 may comprise processors 804A-804E and a memory 804G utilized by sand processors. Each of the processors 804A-804E may include a memory interface, 904A-904E, respectively, to send/receive data to/front the memory 804G.

The baseband circuitry 804 may further include one or more interfaces to communicatively couple to other circuitries/devices, such as a memory interface 912 (e.g., an interface to send receive data to/from memory external to the baseband circuitry 804), an application circuitry interface 914 (e.g., an interface to send receive data to from the application circuitry 802 of FIG. 8), an RF circuitry interface 916 (e.g., an interface to send/receive data to/from RF circuitry 806 of FIG. 8), a wireless hardware connectivity interface 918 (e.g., an interface to send/receive data to/from Near Field Communication (NFC) components, Bluetooth® components (e.g., Bluetooth® Low Energy), Wi-Fi® components, and other communication components), and a power management interface 920 (e.g., an interface to send/receive power or control signals to/from the PMC 812.

It is pointed out that elements of any of the Figures herein having reference numbers and/or names that correspond with reference numbers and/or names of any other Figure herein may, in various embodiments, operate or function in a manner similar to those corresponding elements of the other Figure (without being limited to operating or functioning in such a manner).

Reference in the specification to "an embodiment," "one embodiment," "some embodiments," or "other embodiments" means that a particular feature, structure or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. For example, other memory architectures e.g., Dynamic RAM (DRAM) may use the embodiments discussed. The embodiments of the disclosure are intended to embrace all such alternatives, modifications, and variations as to fall within the broad scope of the appended claims.

In addition well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or mote embodiments. All optional features of the apparatus described herein may also be implemented with respect to a method or process.

Example 1 provides an apparatus of a User Equipment (UE) operable to Communicate with an Evolved Node D (eNB) on a wireless network, comprising: one or more processors to determine a first parameter set and a second parameter set for establishing Physical Downlink Shared Channel (PDSCH) resources; process a first part of a PDSCH transmission from a first set of Multiple Input Multiple Output (MIMO) layers corresponding with a first Multimedia Broadcast Single Frequency Network (MBSFN) configuration based on the first parameter set; and process a second part of the PDSCH transmission from a second set of MIMO layers corresponding with a second MBSFN configuration based on the second parameter set, and an interface for receiving the PDSCH transmission from a receiving circuitry.

In example 2, the apparatus of example 1, wherein the one or more processors are to: process a configuration transmission carrying at least one of the first parameter set and the second parameter set.

In example 3, the apparatus of any of examples 1 through 2, wherein a scheduled Downlink (DL) subframe is an MBSFN subframe for the first parameter set and a non-MBSFN subframe for the second parameter set.

In example 4, the apparatus of any of examples 1 through 3, wherein a starting PDSCH Orthogonal Frequency Division Multiplexing (OFDM symbol index of the PDSCH transmission is the minimum of: two; or a starting PDSCH symbol index of the first parameter set.

In example 5, the apparatus of am of examples 1 through 4, wherein a starting PDSCH Orthogonal Frequency Division Multiplexing (OFDM) symbol index of the PDSCH transmission, a starting PDSCH symbol index of the first parameter set, and a starting PDSCH symbol index of the second parameter set are the same value.

Example 6 provides a User Equipment (UE) device comprising an application processor, a memory, one or more antennas, a wireless interface for allowing the application processor to communicate with another device, and a touchscreen display, the UE device including the apparatus of any of examples through 5.

In example 7, Machine readable storage media having machine executable instructions that, when executed, cause one or more processors of a User Equipment (UE) operable to communicate with an Evolved Node-B (eNB) on a wireless network to perform an operation comprising determine a first parameter set and a second parameter set for establishing Physical Downlink Shared Channel (PDSCH) resources; process a first part of a PDSCH transmission from a first set of Multiple Input Multiple Output (MIMO) layers corresponding with a first Multimedia Broadcast Single Frequency Network (MBSFN) configuration based on the first parameter set; and process a second part of the PDSCH transmission from a second set of MIMO layers corresponding with a second MBSFN configuration based on the second parameter set.

In example 8, the machine readable storage media of example 7, the operation comprising: process a configuration transmission earning at least one of the first parameter set and the second parameter set.

In example 9, the machine readable storage media of any of examples 7 through 8, wherein a scheduled Downlink (DL) subframe is an MBSFN subframe for the first parameter set and a non-MBSFN subframe for the second parameter set.

In example 10, the machine readable storage media of any of examples 7 through 9, wherein a starting PDSCH Orthogonal Frequency Division Multiplexing (OFDM) symbol index of the PDSCH transmission is the minimum of: two; or a starting PDSCH symbol index of the first parameter set.

In example 11, the machine readable storage media of any of examples 7 through 10, wherein a starting PDSCH Orthogonal Frequency Division Multiplexing (OFDM) symbol index of the PDSCH transmission, a starting PDSCH symbol index of the first parameter set, and a starting PDSCH symbol index of the second parameter set are the same value.

Example 12 provides an apparatus of a User Equipment (UE) operable to communicate with an Evolved Node B (eNB) on a wireless network, comprising one or more processors to: establish a first Channel State information (CSI) component of a CSI transmission payload the first CSI component having a predetermined number of bits, and the first CSI component corresponding to a first number of zero-padding bits, establish a second CSI component of the CSI transmission payload, the second CSI component having a number of bits based upon a total size in bits of the CSI transmission pay load, and the second CSI component corresponding to a second number of zero-padding bits; and encode a polar-coded CSI transmission carrying the first number of zero-padding bits, the first CSI component, the second number of zero-padding bits, and the second CSI component, and an interface for sending the polar-coded CSI transmission to a transmission circuitry.

In example 13, the apparatus of example 12, wherein the one or more processors are to: calculate the size in bits of the CSI transmission pay load.

In example 14, the apparatus of example 13, wherein the first number of zero-padding bits is set at the difference between a mother code length of a corresponding polar code in bits and a maximum CSI payload size in bits.

In example 15, the apparatus of example 12, wherein the encoding of the polar-coded CSI transmission is performed by mapping the first CSI component to a set of most reliable entries of a polar encoder among a subset of entries corresponding with the first CSI component; wherein the emending of the polar-coded CSI transmission is performed by mapping the second CSI component to a set of most reliable entries of a polar encoder among a subset of entries corresponding with the second CSI component.

In example 16, the apparatus of example 15, wherein the subset of entries corresponding with the first CSI component comprises a number N1 of polar encoder entries corresponding with first-decoded bits, N1 being a sum of a number of bits of the first CSI component and the first number of zero-padding bits; wherein the subset of entries corresponding with the second CSI component comprises a number N2 of polar encoder entries, N2 being a sum of a number of bits of the second CSI component and the second number of zero-padding bits.

In example 17, the apparatus of example 14, wherein an actual CSI payload size in bits is a sum of a number of bits of the first CSI component and a number of bits of the second CSI component; and wherein the second number of zero-padding bits is set at the difference between the maximum CSI payload size in bits and the actual CSI payload size in bits.

In example 18, the apparatus of any of examples 12 through 17, wherein the first CSI component includes one or more of: a minimum number of Preceding Matrix indication (PMI) bits; a minimum number of Channel Quality Indicator (CQI) bits; a number of Rank Indication (RI) bits; a minimum number of Layer Indicator (LI) bits; or a number of Channel State Information Reference Signal (CSI-RS) Resource Index (CRI) bits.

In example 19, the apparatus of example 18, wherein the second CSI component includes one or more of: a remaining number of PMI bits; a remaining number of CQI bits; or a remaining number of LI bits.

Example 20 provides a User Equipment (UE) device comprising an application processor, a memory, one or more antennas, a wireless interface for allowing the application processor to communicate with another device, and a touchscreen display, the UE device including the apparatus oi any of examples 12 through 19.

Example 21 provides machine readable storage media having machine executable instructions that, when executed, cause one or more processors of a User Equipment (UE) operable to communicate with an Evolved Node-B (eNB) on a wireless network to perform an operation comprising establish a first Channel State Information (CSI) component of a CSI transmission payload, the first CSI component having a predetermined number of bits, and the first CSI component corresponding to a first number of zero-padding bits; establish a second CSI component of the CSI transmission payload, the second CSI component having a number of bits based upon a total size in bits of the CSI transmission payload, and the second CSI component corresponding to a second number of zero-padding bits; and encode a polar-coded CSI transmission carrying the first number of zero-padding bits, the first CSI component, the second number of zero-padding bits, and the second CSI component.

In example 22, the machine readable storage media of example 21, the operation comprising: calculate the size in bits of the CSI transmission payload.

In example 23, the machine readable storage media of example 22, wherein the first number of zero-padding bits is set at the difference between a mother code length of a corresponding polar code in bits and a maximum CSI payload size in bits.

In example 24, the machine readable storage media of example 21 wherein the encoding of the polar-coded CSI transmission is performed by mapping the first CSI component to a set of most reliable entries of a polar encoder among a subset of entries corresponding with the first CSI component; wherein the encoding of the polar-coded CSI transmission is performed by mapping the second CSI component to a set of most reliable entries of a polar encoder among a subset of entries corresponding with the second CSI component.

In example 25, the machine readable storage media of example 24 wherein the subset of entries corresponding with the first CSI component comprises a number N1 of polar encoder entries corresponding with first-decoded bits, N1 being a sum of a number of bits of the first CSI component and the first number of zero-padding bits; wherein the subset of entries corresponding with the second CSI component comprises a number N2 of polar encoder entries, N2 being a sum of a number of bits of the second CSI component and the second number of zero-padding bits.

In example 26, the machine readable storage media of example 23, wherein an actual CSI payload size in bits is a sum of a number of bits of the first CSI component and a number of bits of the second CSI component, and wherein the second number of zero-padding bits is set at the difference between the maximum CSI payload size in bits and the actual CSI payload size in bits.

In example 27, the machine readable storage media of any of examples 21 through 26, wherein the first CSI component includes one or more of a minimum number of Precoding Matrix Indication (PMI) bits; a minimum number of Channel Quality Indicator (CQI) bits, a number of Rank Indication (RS) bits; a minimum number of Layer Indicator (LI) bits, or a number of Channel State Information Reference Signal (CSI-RS) Resource Index (CRI) bits.

In example 28, the machine readable storage media of example 27, wherein the second CSI component includes one or more of: a remaining number of PMI bits; a remaining number of CQI bits; or a remaining number of LI bits.

In example 29, the apparatus of any of examples 1 through 5, and 12 through 19, wherein the one or more processors comprise a baseband processor.

In example 30, the apparatus of any of examples 1 through 5, and 12 through 19, comprising a memory for storing instructions, the mentors being coupled to the one or more processors.

In example 31, the apparatus of any of examples 1 through 5, and 12 through 19, comprising a transceiver circuitry for at least one of: generating transmissions, encoding transmissions, processing transmissions, or decoding transmissions.

In example 32, the apparatus of any of examples 1 through 5, and 12 through 19, comprising a transceiver circuitry for generating transmissions and processing transmissions.

An abstract is provided that will allow the reader to ascertain the nature and gist of the technical disclosure. The abstract is submitted with the understanding that it will not be used to limit the scope or meaning of the claims. The following claims are hereby incorporated into the detailed description, wish each claim standing on its own as a separate embodiment.

What is claimed is:

1. A User Equipment (UE) operable to communicate with a base station on a wireless network, comprising:
 one or more processors to:
  establish a first Channel State information (CSI) component of a CSI transmission payload, the first CSI component having a predetermined number of bits, and the first CSI component corresponding to a first number of zero-padding bits;
  establish a second CSI component of the CSI transmission payload, the second CSI component having a number of bits based upon a total size in bits of the CSI transmission payload, and the second CSI component corresponding to a second number of zero-padding bits; and encode a polar-coded CSI transmission carrying the first number of zero-padding bits, the first CSI component, the second number of zero-padding bits, and the second CSI component, and an interface for sending the polar-coded CSI transmission to a transmission circuitry.

2. The UE of claim 1, wherein the one or more processors are to:
calculate the total size in bits of the CSI transmission payload.

3. The UE of claim 2, wherein the first number of zero-padding bits is set at a difference between a mother code length of a corresponding polar code in bits and a maximum CSI payload size in bits.

4. The UE of claim 3,
wherein an actual CSI payload size in bits is a sum of a number of bits of the first CSI component and a number of bits of the second CSI component; and
wherein the second number of zero-padding bits is set at the difference between the maximum CSI payload size in bits and the actual CSI payload size in bits.

5. The UE of claim 1,
wherein the encoding of the polar-coded CSI transmission is performed by mapping the first CSI component to a set of most reliable entries of a polar encoder among a subset of entries corresponding with the first CSI component; and
wherein the encoding of the polar-coded CSI transmission is performed by mapping the second CSI component to a set of most reliable entries of an other polar encoder among a subset of entries corresponding with the second CSI component.

6. The UE of claim 5,
wherein the subset of entries corresponding with the first CSI component comprises a number N1 of polar encoder entries corresponding with first-decoded bits, N1 being a sum of a number of bits of the first CSI component and the first number of zero-padding bits; and
wherein the subset of entries corresponding with the second CSI component comprises a number N2 of polar encoder entries, N2 being a sum of a number of bits of the second CSI component and the second number of zero-padding bits.

7. The UE of claim 1, wherein the first CSI component includes one or more of: a minimum number of Precoding Matrix Indication (PMI) bits; a minimum number of Channel Quality Indicator (CQI) bits; a number of Rank Indication (RI) bits; a minimum number of Layer Indicator (LI) bits; or a number of Channel State Information Reference Signal (CSI-RS) Resource Index (CRI) bits.

8. One or more non-transitory machine readable storage media having machine executable instructions that, when executed, cause one or more processors of a User Equipment (UE) operable to communicate with a base station on a wireless network to perform an operation comprising:
establishing a first Channel State Information (CSI) component of a CSI transmission payload, the first CSI component having a predetermined number of bits, and the first CSI component corresponding to a first number of zero-padding bits;
establishing a second CSI component of the CSI transmission payload, the second CSI component having a number of bits based upon a total size in bits of the CSI transmission payload, and the second CSI component corresponding to a second number of zero-padding bits; and encoding a polar-coded CSI transmission carrying the first number of zero-padding bits, the first CSI component, the second number of zero-padding bits, and the second CSI component.

9. The one or more non-transitory machine readable storage media of claim 8, wherein the operation comprising:
calculating the total size in bits of the CSI transmission payload.

10. The one or more non-transitory machine readable storage media of claim 9,
wherein the first number of zero-padding bits is set at a difference between a mother code length of a corresponding polar code in bits and a maximum CSI payload size in bits.

11. The one or more non-transitory machine readable storage media of claim 10,
wherein an actual CSI payload size in bits is a sum of a number of bits of the first CSI component and a number of bits of the second CSI component; and
wherein the second number of zero-padding bits is set at a difference between the maximum CSI payload size in bits and the actual CSI payload size in bits.

12. The one or more non-transitory machine readable storage media of claim 8,
wherein the encoding of the polar-coded CSI transmission is performed by mapping the first CSI component to a set of most reliable entries of a polar encoder among a subset of entries corresponding with the first CSI component; and
wherein the encoding of the polar-coded CSI transmission is performed by mapping the second CSI component to a set of most reliable entries of an other polar encoder among a subset of entries corresponding with the second CSI component.

13. The one or more non-transitory machine readable storage media of claim 12,
wherein the subset of entries corresponding with the first CSI component comprises a number N1 of polar encoder entries corresponding with first-decoded bits, N1 being a sum of a number of bits of the first CSI component and the first number of zero-padding bits;
wherein the subset of entries corresponding with the second CSI component comprises number N2 of polar encoder entries, N2 being a sum of a number of bits of the second CSI component and the second number of zero-padding bits.

14. The one or more non-transitory machine readable storage media of claim 8,
wherein the first CSI component includes one or more of: a minimum number of Precoding Matrix Indication (PMI) bits; a minimum number of Channel Quality Indicator (CQI) bits; a number of Rank Indication (RI) bits; a minimum number of Layer Indicator (LI) bits; or a number of Channel State Information Reference Signal (CSI-RS) Resource Index (CRI) bits.

15. A method performed by a User Equipment (UE), comprising:
establishing a first Channel State Information (CSI) component of a CSI transmission payload, the first CSI component having a predetermined number of bits, and the first CSI component corresponding to a first number of zero-padding bits;
establishing a second CSI component of the CSI transmission payload, the second CSI component having a number of bits based upon a total size in bits of the CSI transmission payload, and the second CSI component corresponding to a second number of zero-padding bits; and encoding a polar-coded CSI transmission carrying the first number of zero-padding bits, the first CSI component, the second number of zero-padding bits, and the second CSI component.

16. The method of claim 15, further comprising:
calculating the total size in bits of the CSI transmission payload.

17. The method of claim 16, wherein the first number of zero-padding bits is set at a difference between a mother code length of a corresponding polar code in bits and a maximum CSI payload size in bits.

18. The method of claim 15,
wherein the encoding of the polar-coded CSI transmission is performed by mapping the first CSI component to a set of most reliable entries of a polar encoder among a subset of entries corresponding with the first CSI component; and
wherein the encoding of the polar-coded CSI transmission is performed by mapping the second CSI component to a set of most reliable entries of an other polar encoder among a subset of entries corresponding with the second CSI component.

19. The method of claim 18,
wherein the subset of entries corresponding with the first CSI component comprises a number N1 of polar encoder entries corresponding with first-decoded bits, N1 being a sum of a number of bits of the first CSI component and the first number of zero-padding bits; and
wherein the subset of entries corresponding with the second CSI component comprises a number N2 of polar encoder entries, N2 being a sum of a number of bits of the second CSI component and the second number of zero-padding bits.

20. The method of claim 17,
wherein an actual CSI payload size in bits is a sum of a number of bits of the first CSI component and a number of bits of the second CSI component; and
wherein the second number of zero-padding bits is set at a difference between the maximum CSI payload size in bits and the actual CSI payload size in bits.

* * * * *